US009472592B2

(12) United States Patent
Ikeda et al.

(10) Patent No.: US 9,472,592 B2
(45) Date of Patent: Oct. 18, 2016

(54) IMAGING DEVICE, ELECTRONIC APPARATUS, AND METHOD OF MANUFACTURING THE IMAGING DEVICE HAVING A REDUCED P-N JUNCTION CAPACITY AT ONE OR MORE OF A FLOATING DIFFUSION SECTION, SOURCE REGION, OR DRAIN REGION

(71) Applicant: Sony Corporation, Tokyo (JP)

(72) Inventors: Harumi Ikeda, Kanagawa (JP);
Atsuhiko Yamamoto, Kanagawa (JP);
Yoshiki Ebiko, Kanagawa (JP);
Takeshi Yanagita, Tokyo (JP)

(73) Assignee: Sony Corporation, Tokyo (JP)

( * ) Notice: Subject to any disclaimer, the term of this patent is extended or adjusted under 35 U.S.C. 154(b) by 1 day.

(21) Appl. No.: 14/338,851

(22) Filed: Jul. 23, 2014

(65) Prior Publication Data
US 2015/0035029 A1    Feb. 5, 2015

(30) Foreign Application Priority Data

Jul. 30, 2013  (JP) ................................ 2013-157986

(51) Int. Cl.
*H01L 27/146* (2006.01)

(52) U.S. Cl.
CPC ...... *H01L 27/14689* (2013.01); *H01L 27/1463* (2013.01); *H01L 27/14641* (2013.01); *H01L 27/14643* (2013.01)

(58) Field of Classification Search
CPC ................... H01L 27/14689; H01L 27/1463; H01L 27/14641; H01L 27/14643
See application file for complete search history.

(56) References Cited

U.S. PATENT DOCUMENTS

| 2007/0187732 A1* | 8/2007 | Goto ................. H01L 27/14679 257/292 |
| 2010/0224766 A1* | 9/2010 | Tateshita ........... H01L 21/82345 250/214.1 |
| 2013/0221410 A1* | 8/2013 | Ahn .................... H01L 31/0232 257/225 |
| 2013/0241023 A1* | 9/2013 | Nishizawa ........ H01L 27/14641 257/446 |
| 2015/0318324 A1* | 11/2015 | Kudoh .............. H01L 27/14603 257/225 |

FOREIGN PATENT DOCUMENTS

| JP | 2008-091788 A | 4/2008 |
| JP | 2008-218756 A | 9/2008 |
| JP | 2012-119492 A | 6/2012 |

* cited by examiner

*Primary Examiner* — Peter Bradford
(74) *Attorney, Agent, or Firm* — Sheridan Ross P.C.

(57) ABSTRACT

An imaging device includes: a photodiode configured to perform photoelectric conversion and to generate electric charge in accordance with an amount of received light; a floating diffusion section configured to accumulate the electric charge generated in the photodiode; a reading circuit configured to output a pixel signal having a voltage in accordance with a level of the electric charge accumulated in the floating diffusion section, the reading circuit including one or a plurality of transistors each having a gate that is electrically connected to a wiring used for selecting a pixel; and an insulating section extending into part or whole of a bottom surface of the floating diffusion section, part or whole of bottom surfaces of source-drain regions in the one or the plurality of transistors, or both. The photodiode, the floating diffusion section, the reading circuit, and the insulating section are provided in a semiconductor layer.

16 Claims, 43 Drawing Sheets

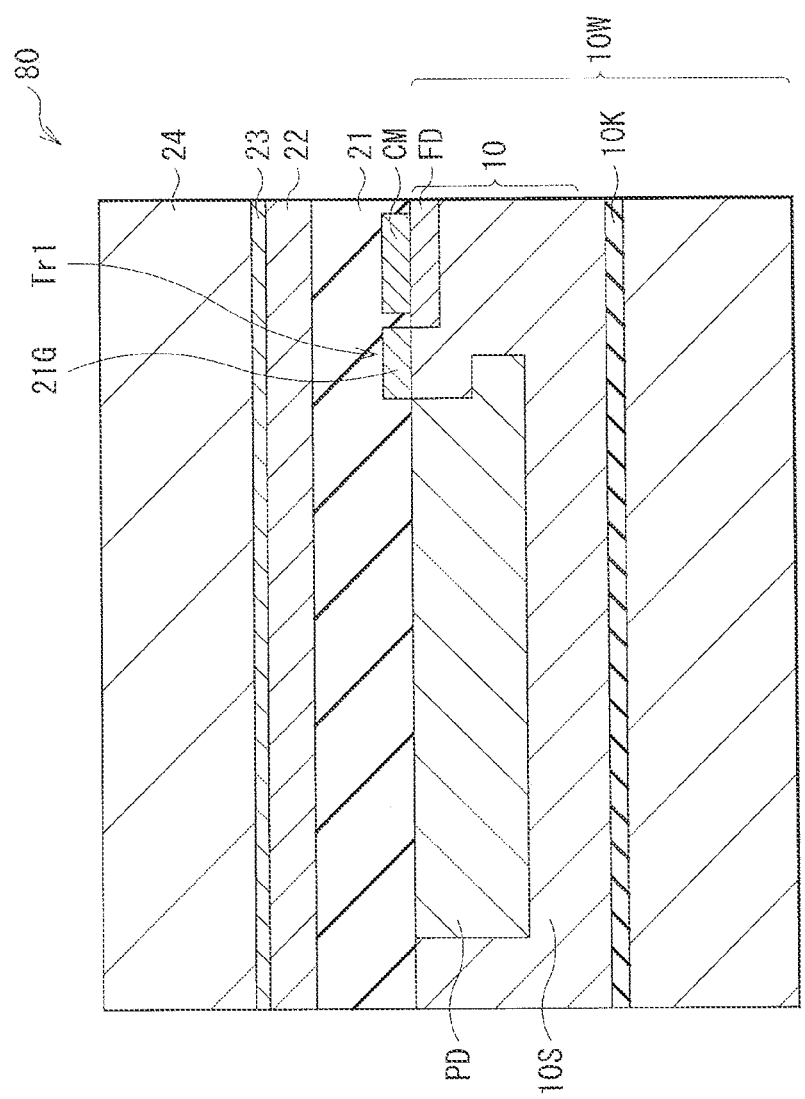

IMAGING DEVICE, ELECTRONIC APPARATUS, AND METHOD OF MANUFACTURING THE IMAGING DEVICE HAVING A REDUCED P-N JUNCTION CAPACITY AT ONE OR MORE OF A FLOATING DIFFUSION SECTION, SOURCE REGION, OR DRAIN REGION

CROSS REFERENCE TO RELATED APPLICATIONS

This application claims the benefit of Japanese Priority Patent Application JP 2013-157986 filed Jul. 30, 2013, the entire contents of each which are incorporated herein by reference.

BACKGROUND

The present technology relates to an imaging device, to an electronic apparatus that includes the imaging device, and to a method of manufacturing an imaging device.

An imaging device such as a CMOS (Complementary Metal Oxide Semiconductor) image sensor or a CCD (Charge Coupled Device) has been widely used for, for example, a digital still camera, a digital video camcorder, and the like. Such an imaging device may include, for example, a photodiode, and a signal reading circuit that reads a photoelectric conversion signal obtained by the photodiode to outside, for each pixel. The signal reading circuit may include, for example, a transfer transistor, an amplifier transistor, a reset transistor, a selection transistor, and the like (for example, see Japanese Unexamined Patent Application Publication No. 2008-91788 (JP2008-91788A)). These transistors may be shared by a plurality of photodiodes in some cases.

In order to achieve low illuminance characteristics equivalent to those of an existing image sensor having ultra-high sensitivity, it is desired to reduce capacity in the signal reading circuit and to improve conversion efficiency of the imaging device. In existing technologies, for example, p-type impurity concentration of a well layer in contact with a FD (Floating Diffusion) section or n-type impurity concentration of the FD section is decreased to suppress p-n junction capacity (for example, see JP2008-91788A and Japanese Unexamined Patent Application Publication No. 2008-218756 (JP2008-218756A)). Moreover, for example, insulating films are provided on both sides of the FD section to suppress the p-n junction capacity (for example, see Japanese Unexamined Patent Application Publication No. 2012-119492 (JP2012-119492A)).

SUMMARY

In the methods disclosed in JP2008-91788A and JP2008-218756A, the impurity concentration is decreased to increase a depletion region, and the p-n junction capacity is suppressed thereby. Therefore, a degree of freedom in layout is limited in accordance with the increase of the depletion region. The method disclosed in JP2008-91788A may lead to decrease in device separation performance between pixels. The method disclosed in JP2012-119492A suppresses the p-n junction capacity only on the both sides of the FD section. In the methods disclosed in JP2008-91788A, JP2008-218756A, and JP2012-119492A, there may still be room for suppressing the p-n junction capacity at a bottom surface of the FD section.

In the signal reading circuit, the p-n junction capacity exists also in source-drain regions of one or a plurality of transistors that each have a gate electrically connected to a wiring used for selecting a pixel. When the p-n junction capacity in the source-drain region is large, wiring delay is caused. Therefore, it is desirable to suppress the p-n junction capacity in the source-drain region. A method similar to those described above may be adopted in order to suppress the p-n junction capacity in the source-drain region. However, there may still be room for suppressing the p-n junction capacity at the bottom surface of the source-drain regions also in this case when any of the above-described methods is adopted.

It is desirable to provide an imaging device capable of effectively suppressing the p-n junction capacity at one or both of the bottom surface of the FD section and the bottom surface of the source-drain region. It is also desirable to provide an electronic apparatus that includes the imaging device, and a method of manufacturing the imaging device.

According to an embodiment of the present technology, there is provided an imaging device including: a photodiode configured to perform photoelectric conversion and to generate electric charge in accordance with an amount of received light; a floating diffusion section configured to accumulate the electric charge generated in the photodiode; a reading circuit configured to output a pixel signal having a voltage in accordance with a level of the electric charge accumulated in the floating diffusion section, the reading circuit including one or a plurality of transistors each having a gate that is electrically connected to a wiring used for selecting a pixel; and an insulating section extending into part or whole of a bottom surface of the floating diffusion section, part or whole of bottom surfaces of source-drain regions in the one or the plurality of transistors, or both. The photodiode, the floating diffusion section, the reading circuit, and the insulating section are provided in a semiconductor layer.

According to an embodiment of the present technology, there is provided an electronic apparatus including: an imaging device; and a signal processing circuit configured to perform a predetermined process on a pixel signal outputted from the imaging device. The imaging device includes: a photodiode configured to perform photoelectric conversion and to generate electric charge in accordance with an amount of received light; a floating diffusion section configured to accumulate the electric charge generated in the photodiode; a reading circuit configured to output a pixel signal having a voltage in accordance with a level of the electric charge accumulated in the floating diffusion section, the reading circuit including one or a plurality of transistors each having a gate that is electrically connected to a wiring used for selecting a pixel; and an insulating section extending into part or whole of a bottom surface of the floating diffusion section, part or whole of bottom surfaces of source-drain regions in the one or the plurality of transistors, or both. The photodiode, the floating diffusion section, the reading circuit, and the insulating section are provided in a semiconductor layer.

In the imaging device and the electronic apparatus according to the above-described embodiments of the present technology, the insulating section extends into part or whole of the bottom surface of the FD section, part or whole of the bottom surfaces of the source-drain regions, or both. In a portion, in the FD section and the source-drain regions, into which the insulating section extends, the p-n junction does not exist. Therefore, compared to a case where the insulating section is not formed, an area of the p-n junction region formed in the bottom surface of the FD section, the bottom surfaces of the source-drain regions, or both is reduced in accordance with the portion into which the insulating section extends.

According to an embodiment of the present technology, there is provided a method of manufacturing an imaging device including:

(A) forming a photodiode, for each of pixels, on a top surface of a semiconductor layer, and forming a floating diffusion section and a reading circuit on the top surface of the semiconductor layer, the photodiode being configured to perform photoelectric conversion and to generate electric charge in accordance with an amount of received light, the floating diffusion section being configured to accumulate the electric charge generated in the photodiode, and the reading circuit configured to output a pixel signal having a voltage in accordance with a level of the electric charge accumulated in the floating diffusion section; and (B) concurrently forming a groove portion and a concave portion on a bottom surface of the semiconductor layer, the groove portion being configured to electrically separate the photodiode for each of the pixels, and the concave portion extending into part or whole of a bottom surface of the floating diffusion section, part or whole of a bottom surface of a source-drain region of a transistor, or both.

In the method of manufacturing the imaging device according to the above-described embodiment of the present technology, the concave portion extends into part or whole of the bottom surface of the FD section, part or whole of the bottom surfaces of the source-drain regions, or both. In a portion, in the FD section and the source-drain regions, into which the concave portion extends, the p-n junction does not exist. Therefore, compared to a case where the concave portion is not formed, an area of the p-n junction region formed in the bottom surface of the FD section, the bottom surfaces of the source-drain regions, or both is smaller by an area of the portion into which the concave portion extends.

According to the imaging device, the electronic apparatus, and the method of manufacturing the imaging device in the above-described embodiments of the present technology, the area of the p-n junction region formed at the bottom surface of one or both of the FD section and the source-drain region is reduced. Therefore, the p-n junction capacity at the bottom surface of one or both of the FD section and the source-drain region is effectively suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 12 is a diagram illustrating an example of a step of manufacturing the imaging device shown in FIG. 1 with the use of a cross-section of a portion corresponding to a portion taken along the line A-A in FIG. 3.

DETAILED DESCRIPTION

Some embodiments of the present technology will be described below in detail with reference to the drawings. The description will be provided in the following order.
1. First Embodiment (Imaging Device)
   An example provided with an insulating section extending into a bottom surface of a FD, bottom surfaces of source-drain regions, or both
2. Modifications (Imaging Device)
   2.1 First Modification
   An example provided with a groove portion
   An example using a mask with an aperture having a varying width
   2.2 Second Modification
   An example provided with a groove portion
   An example using a mask with a lattice-shaped opening
   2.3 Third Modification
   An example provided with a hollow inside a concave portion
   2.4 Fourth Modification
   An example provided with a film having a negative fixed voltage
3. Second Embodiment (Imaging Module)
4. Third Embodiment (Electronic Apparatus)

1. First Embodiment

Configuration

Figure 1:
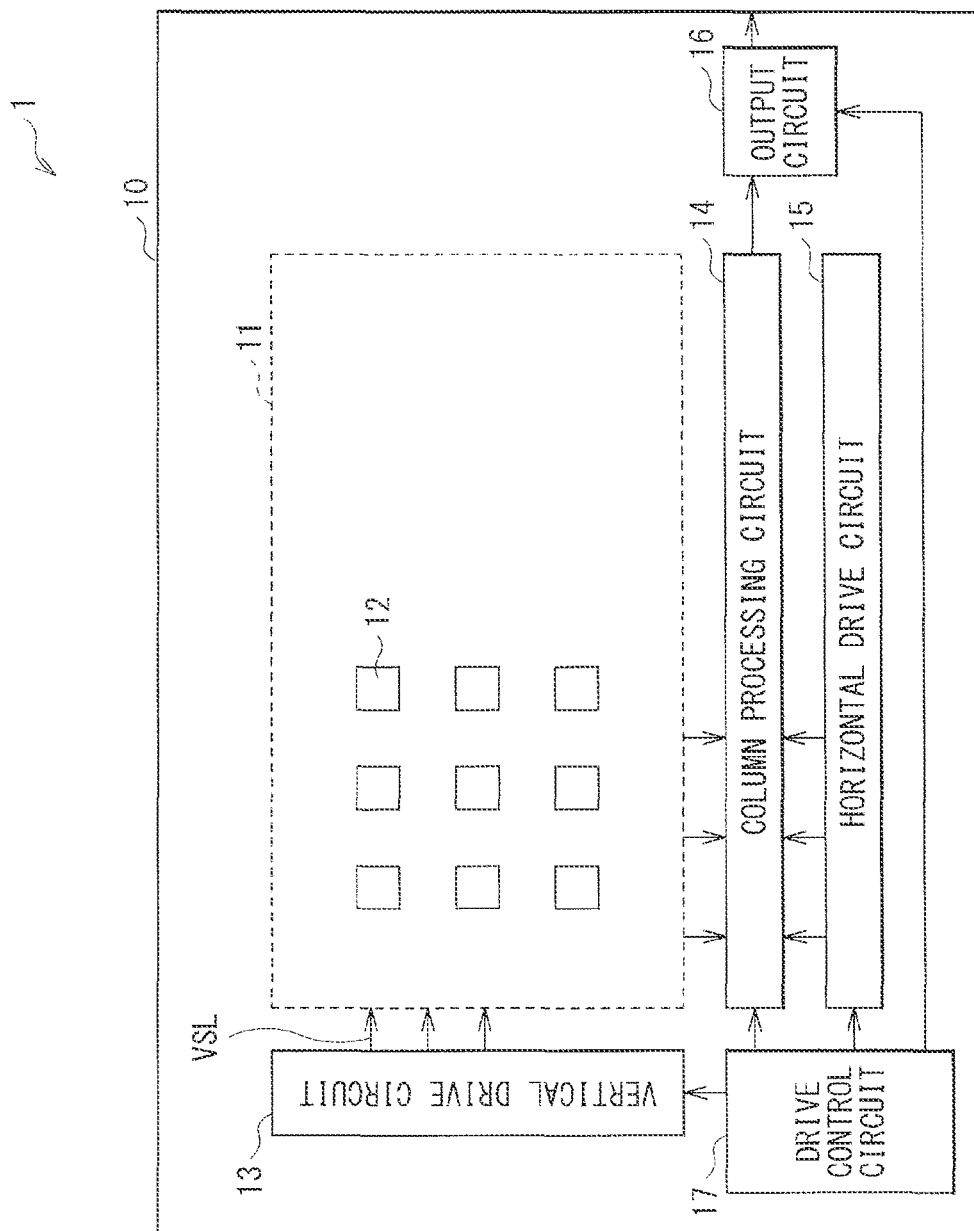
FIG. 1 is a diagram illustrating an example of a schematic configuration of an imaging device according to a first embodiment of the present technology.

FIG. 1 illustrates an example of a schematic configuration of an imaging device 1 according to a first embodiment of the present technology. The imaging device 1 is a CMOS-type solid-state imaging device. The imaging device 1 includes a pixel region 11 in which a plurality of pixels 12 are arranged in a matrix, and peripheral circuits. The imaging device 1 may include, as the peripheral circuits, for example, a vertical drive circuit 13, a column processing circuit 14, a horizontal drive circuit 15, an output circuit 16, and a drive control circuit 17. The pixel region 11 and the peripheral circuits may be formed, for example, on a semiconductor layer 10 as shown in FIG. 1.

The vertical drive circuit 13 may sequentially select the pixels 12 on a row unit basis, for example. The column processing circuit 14 may perform a correlated double sampling (CDS) process on a pixel signal outputted from each of the pixels 12 in a row selected by the vertical drive circuit 13, for example. The column processing circuit 14 may extract a signal level of the pixel signal and hold pixel data based on an amount of received light in each of the pixels 12 by performing the CDS process. The horizontal drive circuit 15 may sequentially output the pixel data held by the column processing circuit 14 to the output circuit 16, for example. The output circuit 16 may amplify the inputted pixel data and output the amplified pixel data to an external signal processing circuit, for example. The drive control circuit 17 may control drive of each block (the vertical drive circuit 13, the column processing circuit 14, the horizontal drive circuit 15, and the output circuit 16) in the peripheral circuits, for example.

Figure 2:
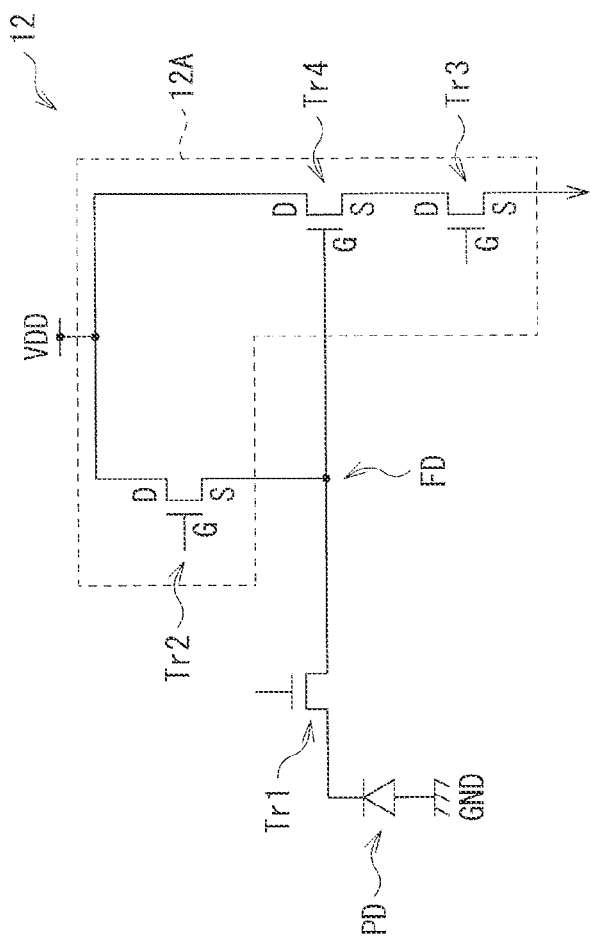
FIG. 2 is a diagram illustrating an example of a circuit configuration in a pixel shown in FIG. 1.

FIG. 2 illustrates an example of a circuit configuration of the pixel 12. The pixel 12 may include, for example, a photodiode PD, a transfer transistor Tr1, a floating diffusion section FD, and a reading circuit 12A. The photodiode PD performs photoelectric conversion and thereby generates electric charge in accordance with the amount of received light. The photodiode PD is configured of an inorganic material. It is to be noted that the reading circuit 12A may be shared by a plurality of pixels 12. The reading circuit 12A may include, for example, a reset transistor Tr2, a selection transistor Tr3, and an amplifier transistor Tr4. The floating diffusion section FD accumulates the electric charge generated in the photodiode PD. The transfer transistor Tr1, the reset transistor Tr2, the selection transistor Tr3, and the amplifier transistor Tr4 are each configured of a CMOS transistor.

A cathode of the photodiode PD is connected to a source of the transfer transistor Tr1, and an anode of the photodiode PD is connected to a reference potential line (for example, to the ground). A drain of the transfer transistor Tr1 is connected to the floating diffusion section FD, and a gate of the transfer transistor Tr1 is connected to a vertical signal line VSL. The vertical signal line VSL is connected to an output terminal of the vertical drive circuit 13. A source of the reset transistor Tr2 is connected to the floating diffusion section FD, and a drain of the reset transistor Tr2 is connected to a power line VDD and to a drain of the amplifier transistor Tr4. A gate of the reset transistor Tr2 is connected to the vertical signal line VSL. A source of the selection transistor Tr3 is connected to the column processing circuit 14, and a drain of the selection transistor Tr3 is connected to a source of the amplifier transistor Tr4. A gate of the selection transistor Tr3 is connected to the vertical signal line VSL. The drain of the amplifier transistor Tr4 is connected to the power line VDD, and a gate of the amplifier transistor Tr4 is connected to the floating diffusion section FD.

When the reset transistor Tr2 is turned on, the reset transistor Tr2 resets a potential of the floating diffusion section FD to a potential of the power line VDD. The selection transistor Tr3 controls a timing of outputting the pixel signal from the reading circuit 12A. The amplifier transistor Tr4 outputs a pixel signal that has a voltage in accordance with a level of the electric charge generated in the photodiode PD. When the selection transistor Tr3 is turned on, the amplifier transistor Tr4 amplifies the potential of the floating diffusion section FD and outputs a voltage in accordance with the amplified potential to the column processing circuit 14.

Figure 3:
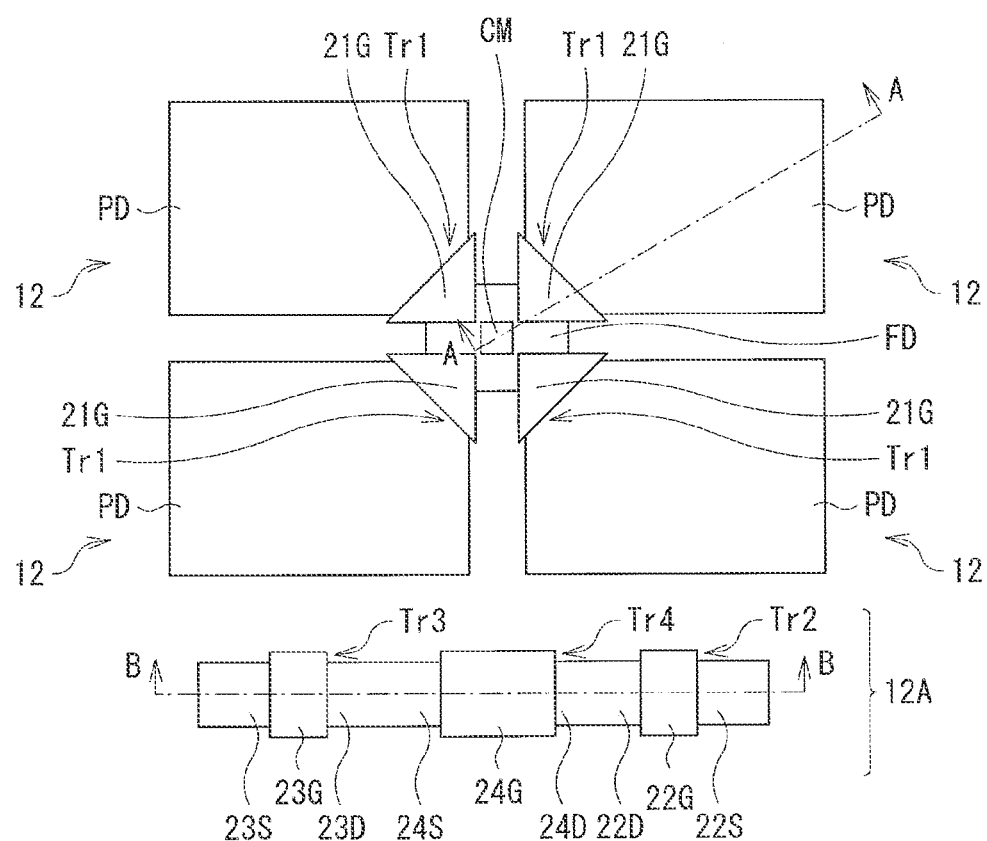
FIG. 3 is a diagram illustrating an example of an in-plane layout of the pixel shown in FIG. 1.
Figure 4:
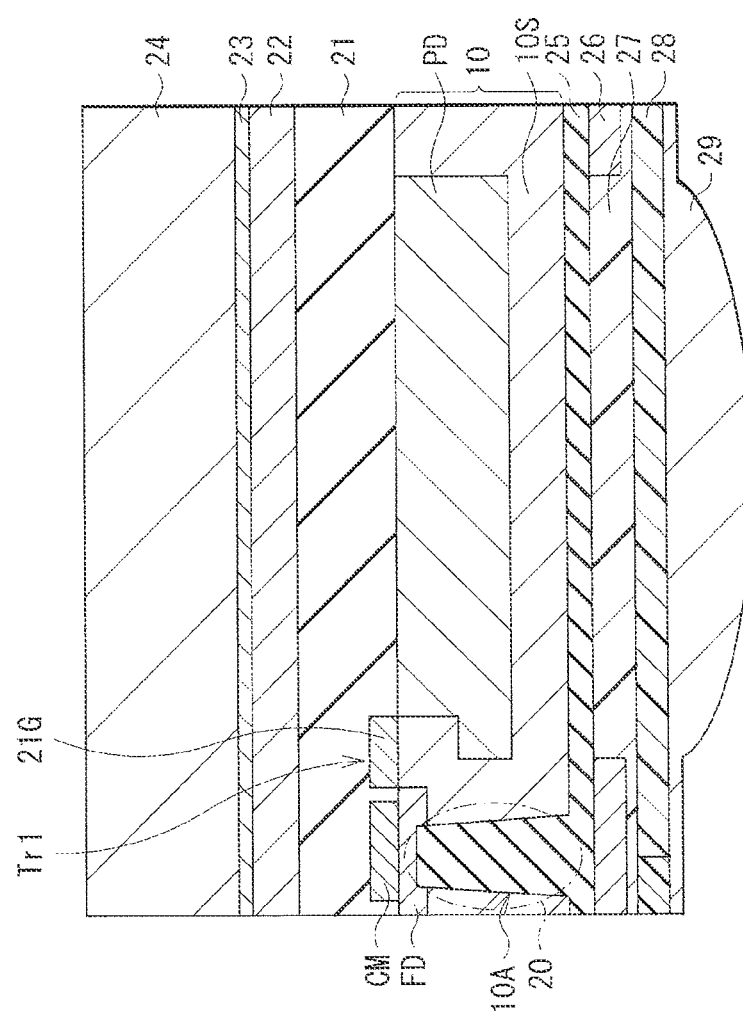
FIG. 4 is a diagram illustrating an example of a cross-sectional configuration taken along a line A-A in FIG. 3 and viewed from a direction of its arrows.
Figure 5:
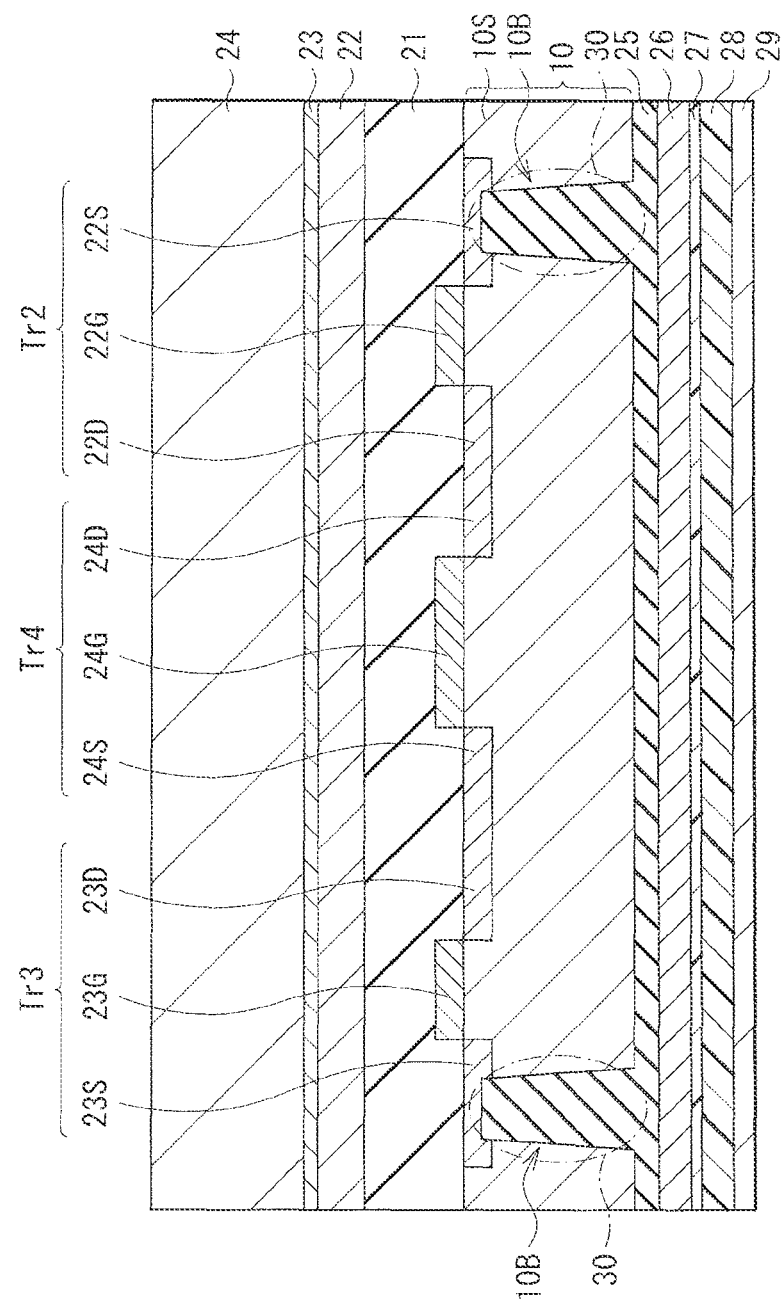
FIG. 5 is a diagram illustrating an example of a cross-sectional configuration taken along a line B-B in FIG. 3 and viewed from a direction of its arrows.

FIG. 3 illustrates an example of an in-plane layout of the pixel 12. FIG. 4 illustrates an example of a configuration of a cross-section taken along a line A-A shown in FIG. 3. FIG. 5 illustrates an example of a configuration of a cross-section taken along a line B-B shown in FIG. 3. FIG. 3 illustrates an example of the in-plane layout of the pixels 12 in a case where the reading circuit 12A is shared by four pixels 12. The in-plane layout of the pixel 12 is not limited to that shown in FIG. 3. The in-plane layout of the four pixels 12 that share the reading circuit 12A is not limited to that shown in FIG. 3.

The pixel 12 may include, for example, the photodiode PD, a PD separation layer 10S, the transfer transistor Tr1, the floating diffusion section FD, and the reading circuit 12A in the semiconductor layer 10 and on one surface (a top surface) of the semiconductor layer 10. The reset transistor Tr2, the selection transistor Tr3, and the amplifier transistor Tr4 that configure the reading circuit 12A may be arranged, for example, in a line. The reset transistor Tr2, the selection transistor Tr3, and the amplifier transistor Tr4 share one active region. A drain region 22D of the reset transistor Tr2 also serves as a drain 24D of the amplifier transistor Tr4, and a drain 23D of the selection transistor Tr3 also serves as a source 24S of the amplifier transistor Tr4.

The photodiode PD may be, for example, an impurity diffusion region that is formed by injecting an impurity into the semiconductor layer 10. The photodiode PD is configured of a semiconductor that has a conductivity type different from that of the PD separation layer 10S. When the conductivity type of the PD separation layer 10S is a p-type, the conductivity type of the photodiode PD is an n-type. The PD separation layer 10S may be formed, for example, in a region, in the semiconductor layer 10, in contact with interfaces with the photodiode PD, the transfer transistor Tr1, the floating diffusion section FD, and the transistors included in the reading circuit 12A. The PD separation layer 10S may be, for example, an impurity diffusion region formed by injecting an impurity into the semiconductor layer 10.

Gate electrodes 21G, 22G, 23G, and 24G of the transfer transistor Tr1, the reset transistor Tr2, the selection transistor Tr3, and the amplifier transistor Tr4 may each be configured, for example, of a polysilicon electrode. Source regions 22S, 23S, and 24S of the reset transistor Tr2, the selection transistor Tr3, and the amplifier transistor Tr4 may each be, for example, an impurity diffusion region formed by injecting an impurity into the semiconductor layer 10. Drain regions 22D, 23D, and 24D of the reset transistor Tr2, the selection transistor Tr3, and the amplifier transistor Tr4 may each be, for example, an impurity diffusion region formed by injecting an impurity into the semiconductor layer 10 as well. The source regions 22S, 23S, and 24S and the drain regions 22D, 23D, and 24D are each configured of a semiconductor that has a conductivity type different from that of the PD separation layer 10S. When the conductivity type of the PD separation layer 10S is a p-type, the conductivity type of the source regions 22S, 23S, and 24S and the drain regions 22D, 23D, and 24D is an n-type.

The floating diffusion section FD may be, for example, an impurity diffusion region formed by injecting an impurity into the semiconductor layer 10. The floating diffusion section FD is configured of a semiconductor that has a conductivity type different from that of the PD separation layer 10S. When the conductivity type of the PD separation layer 10S is a p-type, the conductivity type of the floating diffusion section FD is an n-type. The floating diffusion section FD, the source regions 22S, 23S, and 24S, and the drain regions 22D, 23D, and 24D may have bottom surfaces, for example, at substantially the same depth. For example, the floating diffusion section FD, the source regions 22S, 23S, and 24S and the drain regions 22D, 23D, and 24D may be formed in the same manufacturing process (in other words, may be formed concurrently).

Herein, "bottom surface" is a surface that is in a region closer to a back surface of the semiconductor layer 10, and corresponds to the p-n junction surface that is formed as a result of a difference in conductivity type between the above-described impurity diffusion regions and the PD separation layer 10S. Due to application of a voltage to the above-described impurity diffusion regions, a depletion region (a depletion region 10D which will be described later) in which carriers are hardly present is formed in "bottom surface" and the vicinity thereof. Because of the difference in impurity concentration, generally, the depletion region 10D is formed to be relatively larger in a region closer to the PD separation layer 10S and is formed to be relatively smaller in a region closer to the above-described impurity diffusion region.

The imaging device 1 includes the semiconductor layer 10 in the pixel region 11. Also, the imaging device 1 includes, on one surface (the top surface) of the semiconductor layer 10, an interlayer insulating film 21 including a wiring layer (not illustrated), a planarization layer 22, a close attachment layer 23, and a support substrate 24. The interlayer insulating film 21, the planarization layer 22, the close attachment layer 23, and the support substrate 24 may be laminated in order on the one surface (the top surface) of the semiconductor layer 10, for example. The semiconductor layer 10 may be part of a silicon substrate, or part of an SOI (Silicon On Insulator) substrate, for example. The interlayer insulating film 21 may include, for example, silicon oxide, SiOF, or SiOC. A gate insulating film, the gate electrodes 22G, 23G, and 24G, a metal layer CM, and the like are provided in the interlayer insulating film 21. The metal layer CM is in contact with a top surface of the floating diffusion section FD. The metal layer CM electrically connects the floating diffusion section FD to the source region 22S of the reset transistor Tr2 and to the gate electrode 24G of the amplifier transistor Tr4. The planarization layer 22 planarizes asperities on a top surface of the interlayer insulating film 21. The close attachment layer 23 closely attaches the planarization layer 22 and the support substrate 24 to each other. The close attachment layer 23 may be configured, for example, of a sticking agent, an adhesive agent, or the like. The support substrate 24 supports the semiconductor layer 10, and may be configured, for example, of a silicon substrate.

The imaging device 1 may include, on another surface (the back surface) of the semiconductor layer 10, an insulating film 25, a light blocking film 26, a planarization layer 27, a color filter layer 28, and an on-chip lens 29 in the pixel region 11, for example. The on-chip lens 29 condenses incident light to the photodiode PD for each of the pixels 12.

The color filter 28 may transmit light that has a wavelength range of a specific color (for example, any of red, green, and blue) for each of the pixels 12, for example. The color filter 28 includes an insulating organic material, and may include, for example, an organic material having a dielectric constant of 4 or smaller. The light blocking film 26 prevents part of light that enters one pixel 12 from entering a pixel 12 adjacent thereto. The planarization layer 27 planarizes asperities formed on the back surface by the light blocking film 26 in order to allow the color filter 28 and the on-chip lens 29 to be formed on a planarized surface. The insulating film 25 is for reducing the p-n junction capacity in the semiconductor layer 10, and may include, for example, silicon oxide, SiOF, or SiOC. It is to be noted that the insulating film 25 may serve as the color filter 28. For example, the insulating film 25 may be configured of the materials described above as the materials of the color filter 28. In this case, the color filter 28 is omitted.

Next, main part of the imaging device 1 will be described. As shown in FIG. 4, the imaging device 1 may include, for example, an insulating section 20 that extends into part or whole of the bottom surface of the floating diffusion section FD. Moreover, as shown in FIG. 5, the imaging device 1 may include, for example, an insulating section 30 that extends into part or whole of the bottom surfaces of the source regions 22S and 23S of two transistors (the reset transistor Tr2 and the selection transistor Tr3). The reset transistor Tr2 and the selection transistor Tr3 each correspond to a transistor that has a gate electrically connected to the vertical signal line VSL used for selecting the pixel 12.

FIGS. 6A, 6B, 7A, 7B, 8A, and 8B each illustrate a cross-sectional configuration of the insulating section 20 and the periphery thereof. The insulating section 20 includes a concave portion 10A that is formed in the PD separation layer 10S in the semiconductor layer 10. The concave portion 10A is formed by etching the semiconductor layer 10 from its back surface and has a columnar shape as will be described later. Therefore, the insulating section 20 has a columnar shape that extends in a thickness direction of the semiconductor layer 10. The insulating section 20 includes a filling layer that fills whole of inside of the concave portion 10A. This filling layer is formed by filling the whole of the inside of the concave portion 10A with an insulating film 25.

Figure 6A:
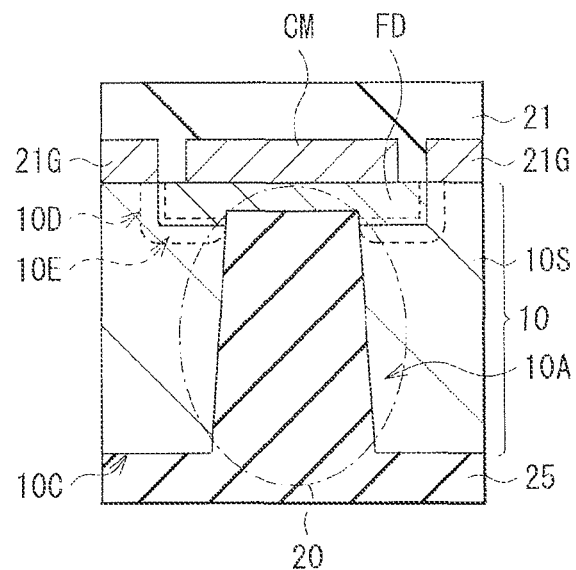
FIG. 6A is a diagram illustrating an example of a cross-sectional configuration of an insulating section and a periphery thereof shown in FIG. 4.

As shown in FIG. 6A, the concave portion 10A may extend into part of a bottom surface 10E of the floating diffusion section FD, for example. In this case, a bottom surface (a top surface of the insulating section 20) of the concave portion 10A is located at a position that is away from the bottom surface 10E of the floating diffusion section FD by a predetermined distance. "Predetermined distance" refers to a thickness of a region, in the floating diffusion section FD, that may be the depletion region 10D. The concave portion 10A may preferably extend to a position (a so-called neutral region) at which impurity concentration of the floating diffusion section FD is $1 \times 10^{18}$ $cm^{-3}$ or higher. Thus, the bottom surface (the top surface of the insulating section 20) of the concave portion 10A is allowed to be formed avoiding the depletion region 10D.

Figure 6B:
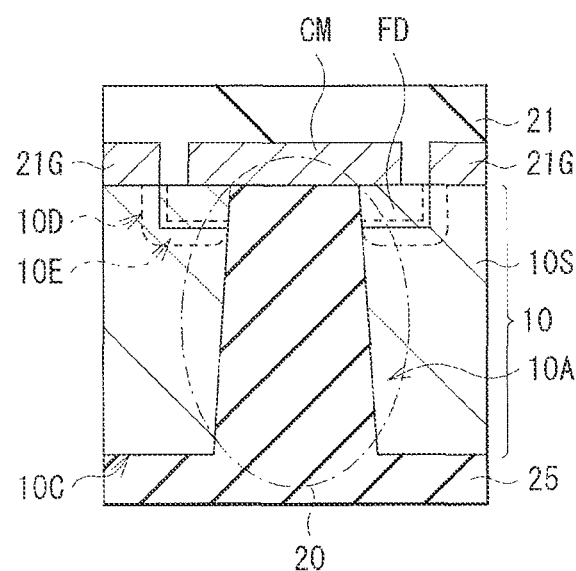
FIG. 6B is a diagram illustrating an example of the cross-sectional configuration of the insulating section and the periphery thereof shown in FIG. 4.
Figure 7A:
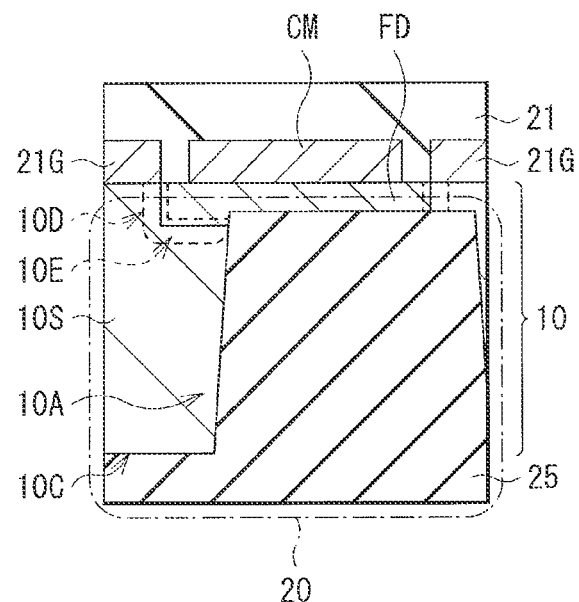
FIG. 7A is a diagram illustrating an example of the cross-sectional configuration of the insulating section and the periphery thereof shown in FIG. 4.
Figure 7B:
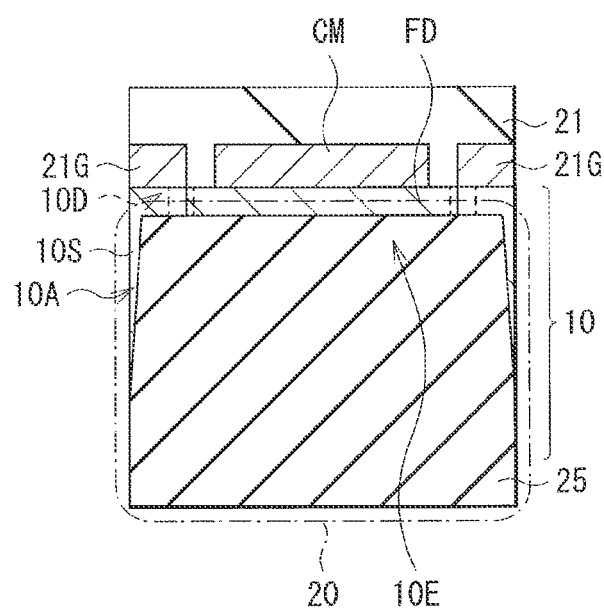
FIG. 7B is a diagram illustrating an example of the cross-sectional configuration of the insulating section and the periphery thereof shown in FIG. 4.
Figure 8A:
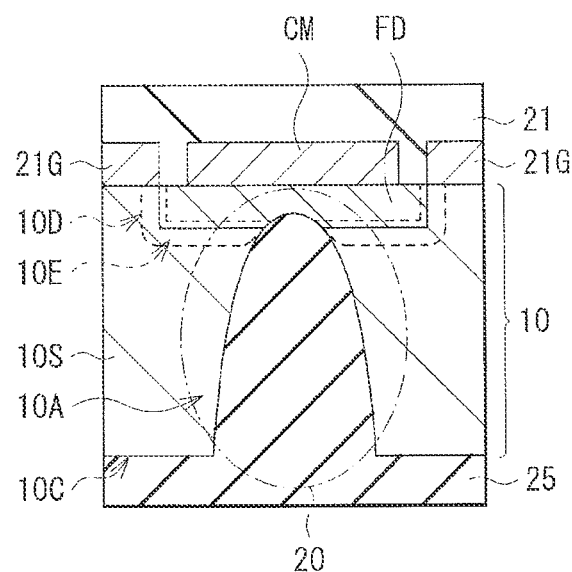
FIG. 8A is a diagram illustrating an example of the cross-sectional configuration of the insulating section and the periphery thereof shown in FIG. 4.
Figure 8B:
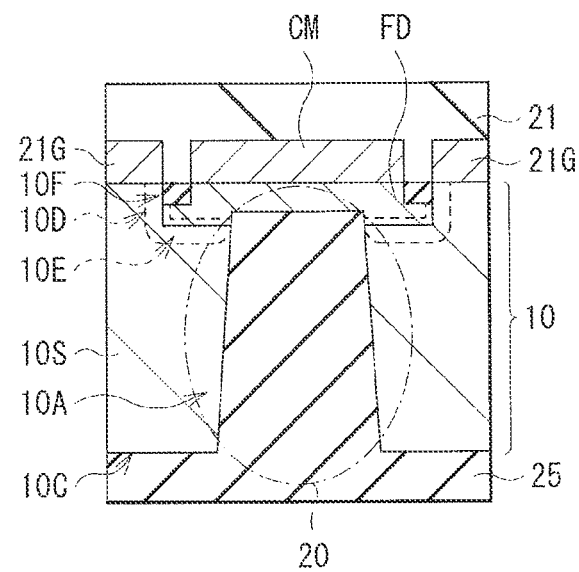
FIG. 8B is a diagram illustrating an example of the cross-sectional configuration of the insulating section and the periphery thereof shown in FIG. 4.

As shown in FIG. 6B, the concave portion 10A may be in contact with the metal layer CM, for example. As shown in FIG. 7A, an end of the bottom surface of the concave portion 10A may extend to outside of the floating diffusion section FD, for example. In this case, the end of the bottom surface of the concave portion 10A may be preferably formed to avoid the depletion region 10D. As shown in FIG. 7B, the concave portion 10A may extend into the whole of the bottom surface 10E of the floating diffusion section FD, for example. In this case, the end of the bottom surface of the concave portion 10A may be preferably formed to avoid the depletion region 10D. As shown in FIG. 8A, the bottom surface of the concave portion 10A may be rounded, for example. In this case, a portion, of the bottom surface of the concave portion 10A, that has a maximum curvature may be preferably formed to avoid the depletion region 10D. As shown in FIG. 8B, for example, an insulating layer 10F may be provided on part or all of a side face of the floating diffusion section FD. The insulating layer 10F may be configured, for example, of a STI device separation region that is formed, for example, by filling a trench formed in the semiconductor layer 10 with an insulating film such as a silicon oxide film. In this case, the concave portion 10A may be in contact with the insulating layer 10F.

FIGS. 9A, 9B, 10A, 10B, 11A, and 11B each illustrate an example of a cross-sectional configuration of the insulating section 30 and the periphery thereof. The insulating section 30 includes a concave portion 10B that is formed in the PD separation layer 10S in the semiconductor layer 10. The concave portion 10B is formed by etching the semiconductor layer 10 from its back surface and has a columnar shape as will be described later. Therefore, the insulating section 30 has a columnar shape that extends in the thickness direction of the semiconductor layer 10. The insulating section 30 includes a filling layer that fills whole of inside of the concave portion 10B. This filling layer is formed by filling the whole of the inside of the concave portion 10B with the insulating film 25.

Figure 9A:
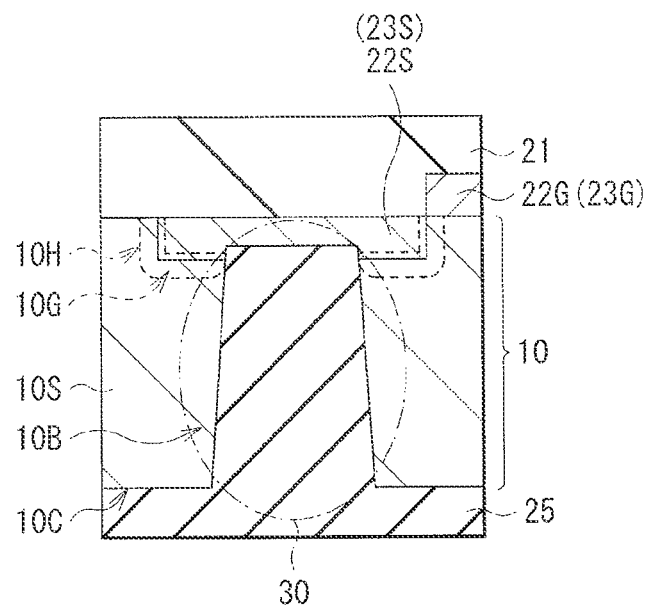
FIG. 9A is a diagram illustrating an example of a cross-sectional configuration of an insulating section and a periphery thereof shown in FIG. 5.

As shown in FIG. 9A, the concave portion 10B may extend into part of a bottom surface 10G of the source region 22S or 23S, for example. In this case, a bottom surface (a top surface of the insulating section 30) of the concave portion 10B is located at a position that is away from the bottom surface 10G of the source region 22S or 23S by a predetermined distance. "Predetermined distance" refers to a thickness of a region, in the source region 22S or 23S, that may be a depletion region 10H. The concave portion 10B may preferably extend to a position (a so-called neutral region) at which impurity concentration of the source region 22S or 23S is $1 \times 10^{18}$ cm$^{-3}$ or higher. Thus, the bottom surface (the top surface of the insulating section 30) of the concave portion 10B is formed avoiding the depletion region 10H.

Figure 9B:
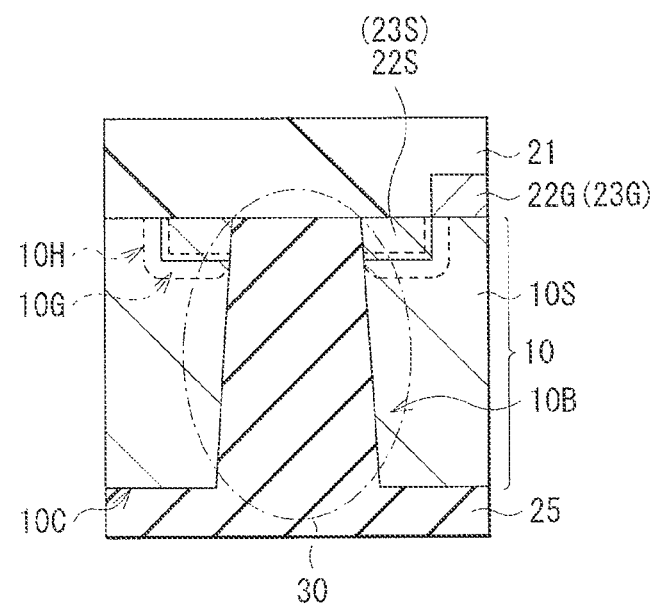
FIG. 9B is a diagram illustrating an example of the cross-sectional configuration of the insulating section and the periphery thereof shown in FIG. 5.
Figure 10A:
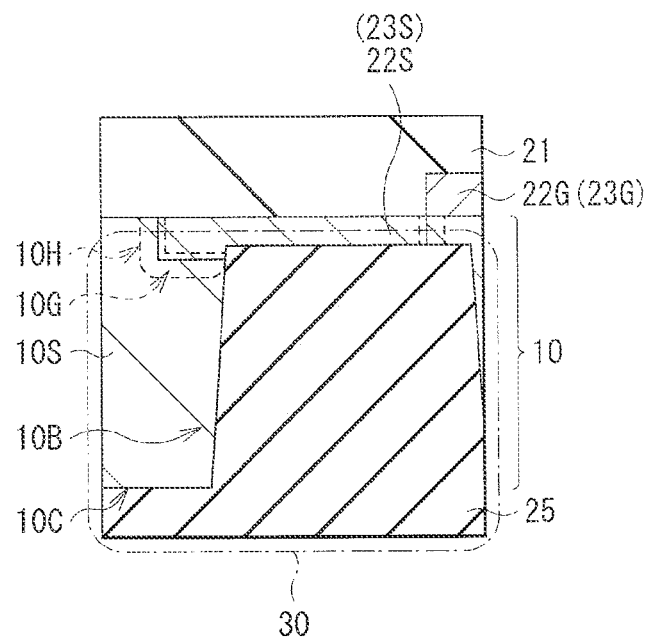
FIG. 10A is a diagram illustrating an example of the cross-sectional configuration of the insulating section and the periphery thereof shown in FIG. 5.
Figure 10B:
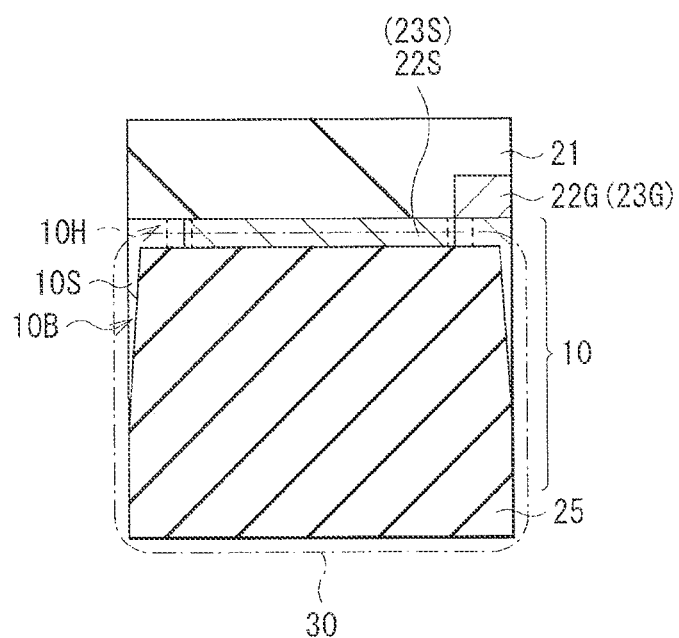
FIG. 10B is a diagram illustrating an example of the cross-sectional configuration of the insulating section and the periphery thereof shown in FIG. 5.
Figure 11A:
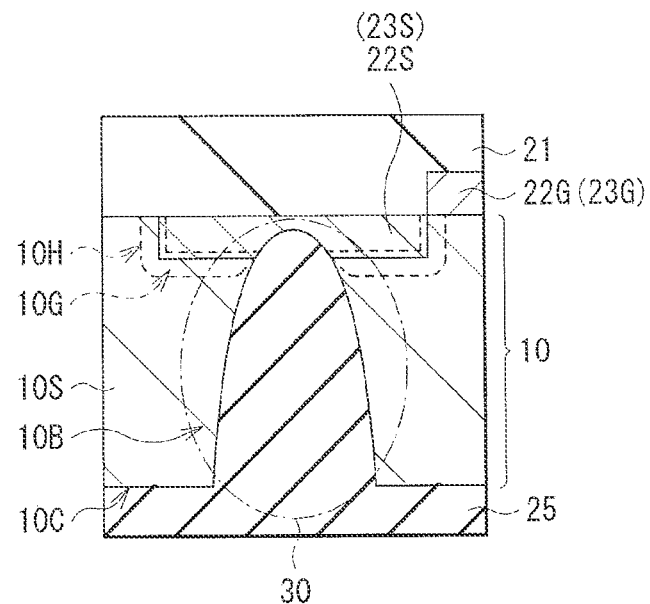
FIG. 11A is a diagram illustrating an example of the cross-sectional configuration of the insulating section and the periphery thereof shown in FIG. 5.
Figure 11B:
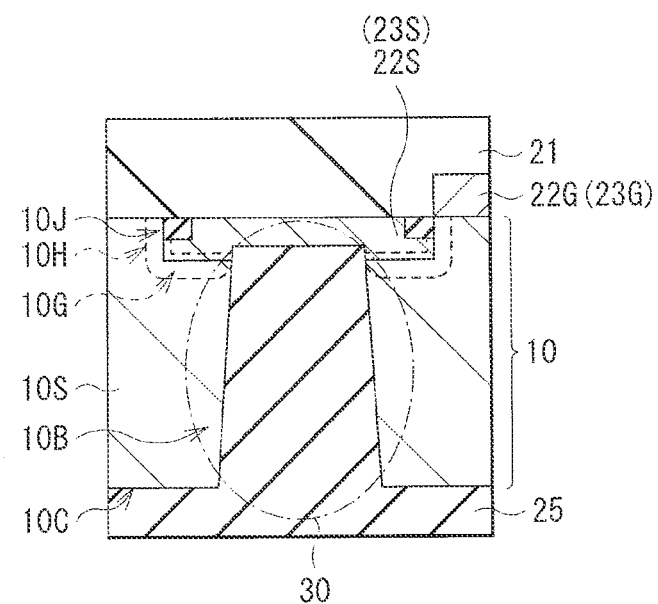
FIG. 11B is a diagram illustrating an example of the cross-sectional configuration of the insulating section and the periphery thereof shown in FIG. 5.

As shown in FIG. 9B, the concave portion 10B may be in contact with the interlayer insulating film 21, for example. As shown in FIG. 10A, an end of the bottom surface of the concave portion 10B may extend to outside of the source region 22S or 23S, for example. In this case, the end of the bottom surface of the concave portion 10B may be preferably formed to avoid the depletion region 10H. As shown in FIG. 10B, the concave portion 10B may extend into the whole of the bottom surface 10G of the source region 22S or 23S, for example. In this case, the end of the bottom surface of the concave portion 10B may be preferably formed to avoid the depletion region 10H. As shown in FIG. 11A, the bottom surface of the concave portion 10B may be rounded, for example. In this case, a portion, of the bottom surface of the concave portion 10B, that has a maximum curvature may be preferably formed to avoid the depletion region 10H. It is to be noted that, as shown in FIG. 11B, for example, an insulating layer 10J may be provided on part or all of a side face of the source region 22S or 23S. The insulating layer 10J may be configured, for example, of a STI device separation region that is formed, for example, by filling a trench formed in the semiconductor layer 10 with an insulating film such as a silicon oxide film.

[Manufacturing Method]

Figure 13:
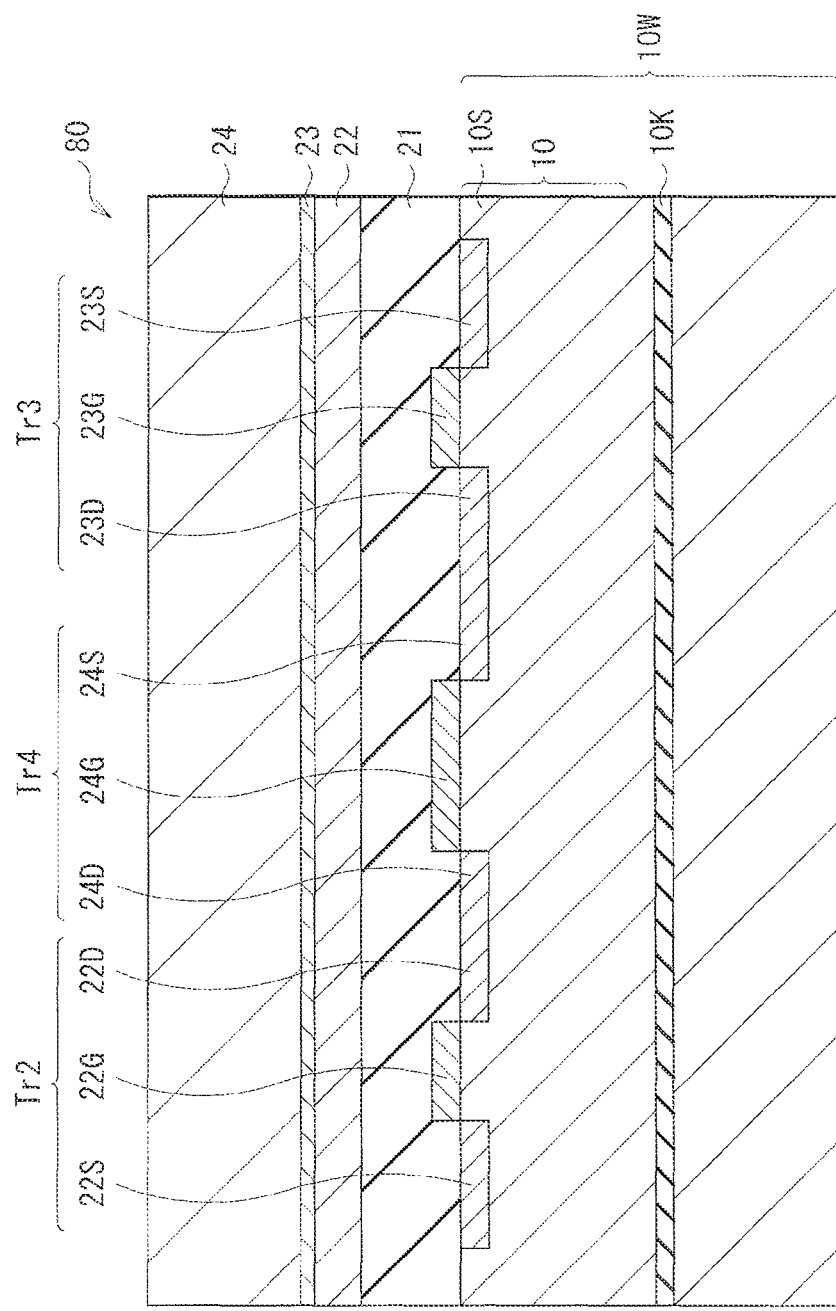
FIG. 13 is a diagram illustrating an example of a configuration of a cross-section of a portion, corresponding to a portion taken along the line B-B in FIG. 3, of a semiconductor layer shown in FIG. 12.
Figure 14:
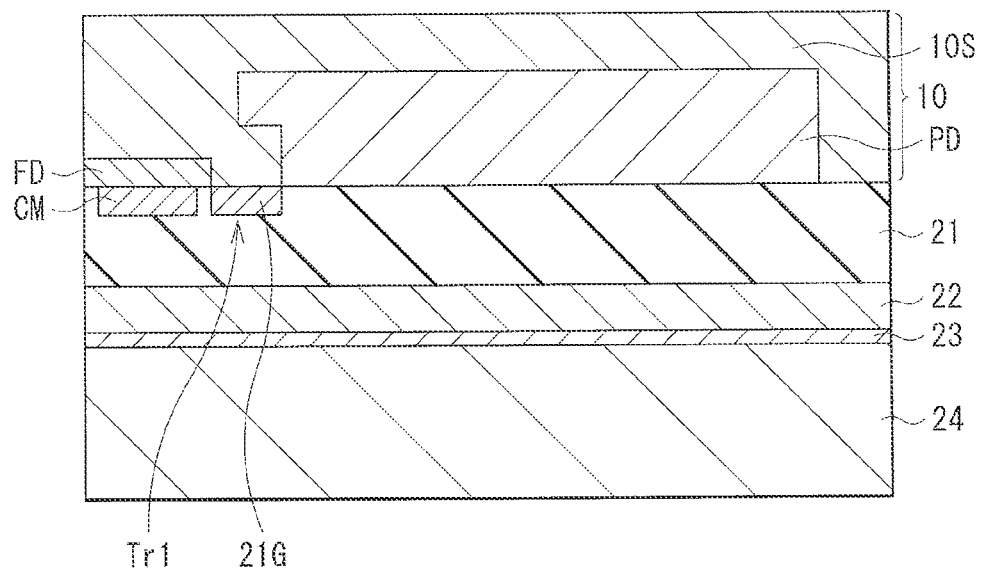
FIG. 14 is a diagram illustrating an example of a manufacturing step following the step shown in FIG. 12 with the use of a cross-section of the portion corresponding to the portion taken along the line A-A in FIG. 3.
Figure 15:
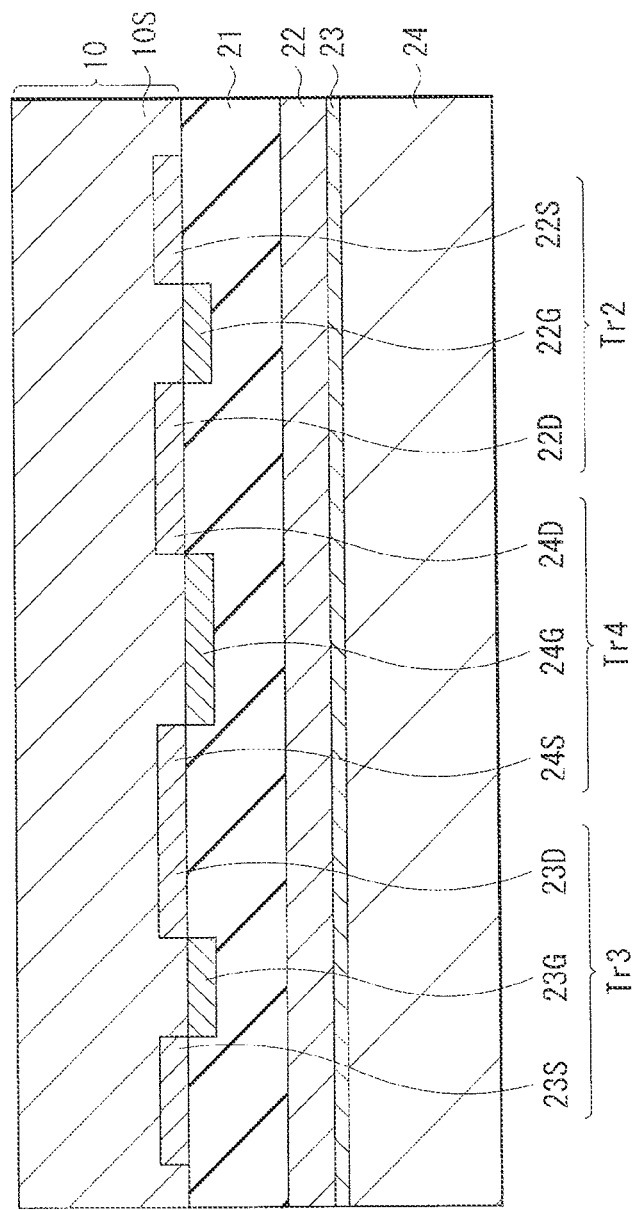
FIG. 15 is a diagram illustrating an example of a configuration of a cross-section of a portion, corresponding to the portion taken along the line B-B in FIG. 3, of the semiconductor layer shown in FIG. 14.
Figure 18:
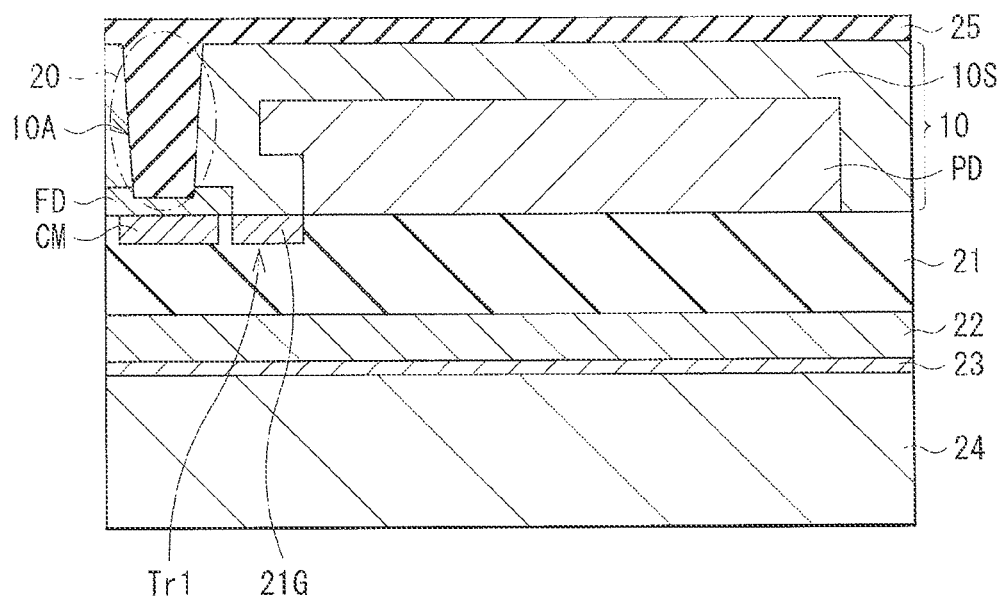
FIG. 18 is a diagram illustrating an example of a manufacturing step following the step shown in FIG. 16 with the use of a cross-section of the portion corresponding to the portion taken along the line A-A in FIG. 3.
Figure 19:
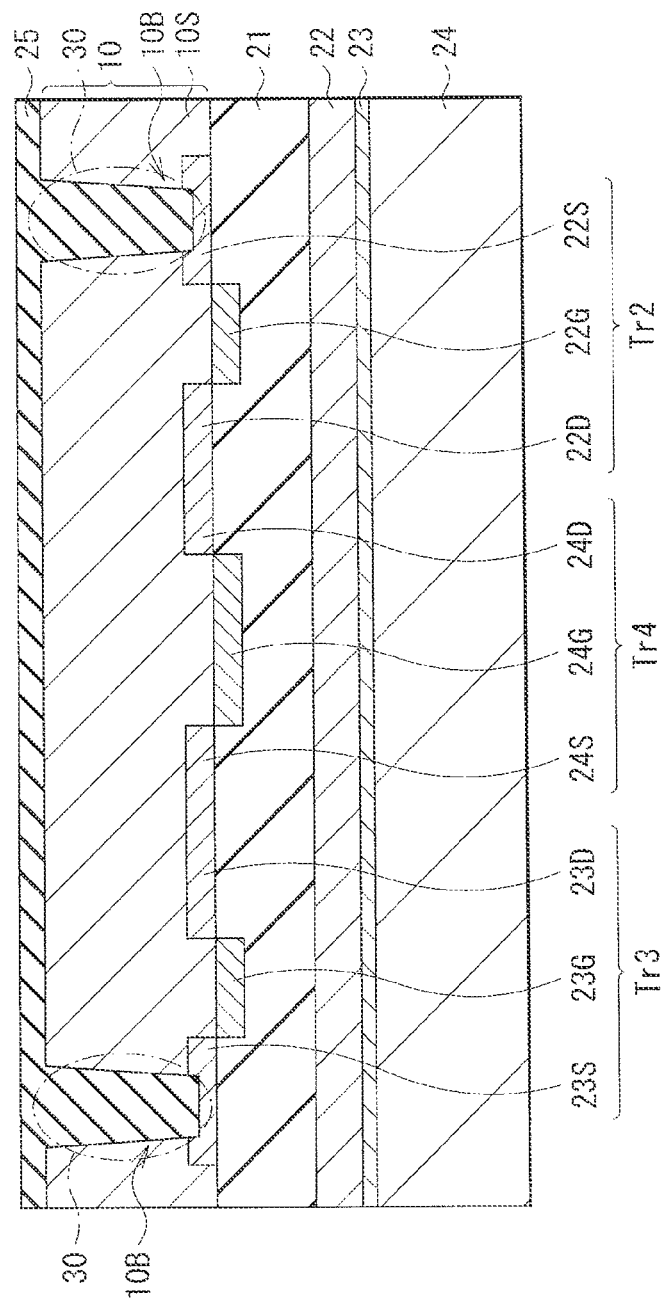
FIG. 19 is a diagram illustrating an example of a configuration of a cross-section of a portion, corresponding to the portion taken along the line B-B in FIG. 3, of the semiconductor layer shown in FIG. 18.

Next, description will be provided of an example of a method of manufacturing the imaging device 1. FIGS. 12 to 19 illustrate a process of manufacturing the imaging device 1 in order. FIGS. 12, 14, 16, and 18 each illustrate an example of a step of manufacturing the imaging device 1 with the use of a cross-section of a portion corresponding to a portion taken along a line A-A in FIG. 3. FIG. 13 illustrates an example of a configuration of a cross-section of a portion, corresponding to the portion taken along the line B-B in FIG. 3, of the semiconductor layer 10 shown in FIG. 12. FIG. 15 illustrates an example of a configuration of a cross-section of a portion, corresponding to the portion taken along the line B-B in FIG. 3, of the semiconductor layer 10 shown in FIG. 14. FIG. 17 illustrates an example of a configuration of a cross-section of a portion, corresponding to the portion taken along the line B-B in FIG. 3, of the semiconductor layer 10 shown in FIG. 16. FIG. 19 illustrates an example of a configuration of a cross-section of a portion, corresponding to the portion taken along the line B-B in FIG. 3, of the semiconductor layer 10 shown in FIG. 18.

First, a semiconductor substrate 10W is prepared (see FIGS. 12 and 13). The semiconductor substrate 10W may be, for example, a substrate configured of an insulating layer 10K and the semiconductor layer 10 formed thereon. A typical example of such a substrate may include a SOI substrate in which the semiconductor layer 10 is configured of a silicon layer. It is to be noted that the semiconductor substrate 10W may be a bulk silicon substrate. Next, the photodiode PD, the PD separation layer 10S, the transfer transistor Tr1, the floating diffusion section FD, and the reading circuit 12A are formed in the semiconductor layer 10 and on the top surface thereof. At this time, for example, the floating diffusion section FD, and the source regions 22S, 23S, and 24S and the drain regions 22D, 23D, and 24D may be formed in the same manufacturing process (in other words, may be formed concurrently). At this time, further, the interlayer insulating film 21 and the planarization film 22 are formed. Subsequently, the support substrate 24 that supports the semiconductor layer 10 is closely attached to a top surface of the planarization film 22 with the close attachment layer 23 in between. Thus, a pixel substrate 80 is formed (FIGS. 12 and 13).

Subsequently, for example, a back surface (the semiconductor substrate 10W) of the pixel substrate 80 may be etched, for example, by a dry etching method (or by a wet etching method) to reduce a thickness of the semiconductor substrate 10W to a predetermined thickness. At this time, when the semiconductor substrate 10W is a substrate configured of the insulating layer 10K and the semiconductor layer 10 formed thereon, the semiconductor substrate 10W is etched until at least the insulating layer 10K is removed (FIGS. 14 and 15).

Figure 16:
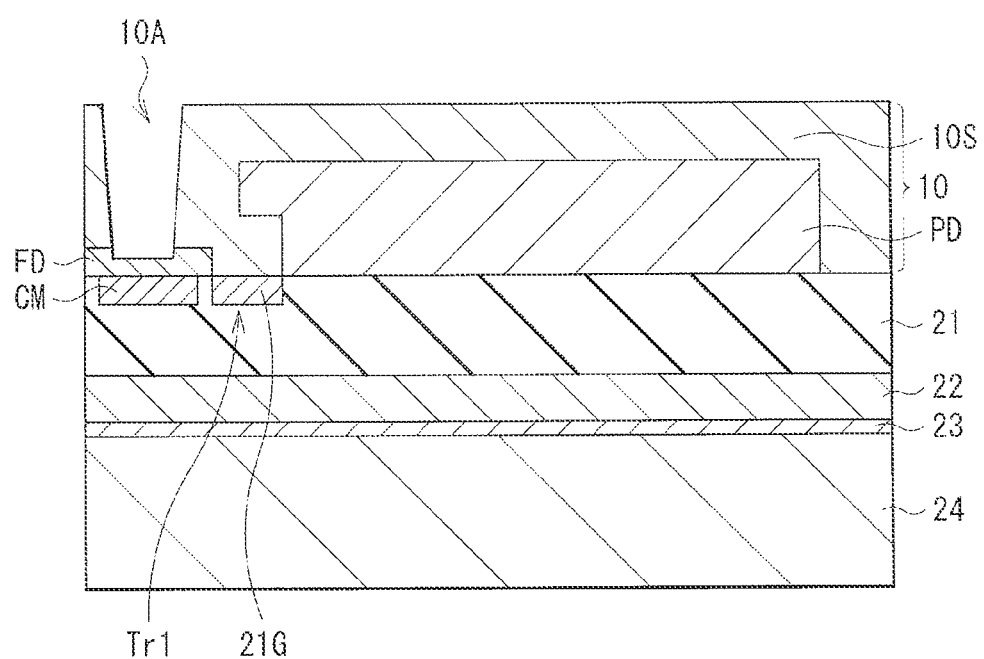
FIG. 16 is a diagram illustrating an example of a manufacturing step following the step shown in FIG. 14 with the use of a cross-section of the portion corresponding to the portion taken along the line A-A in FIG. 3.
Figure 17:
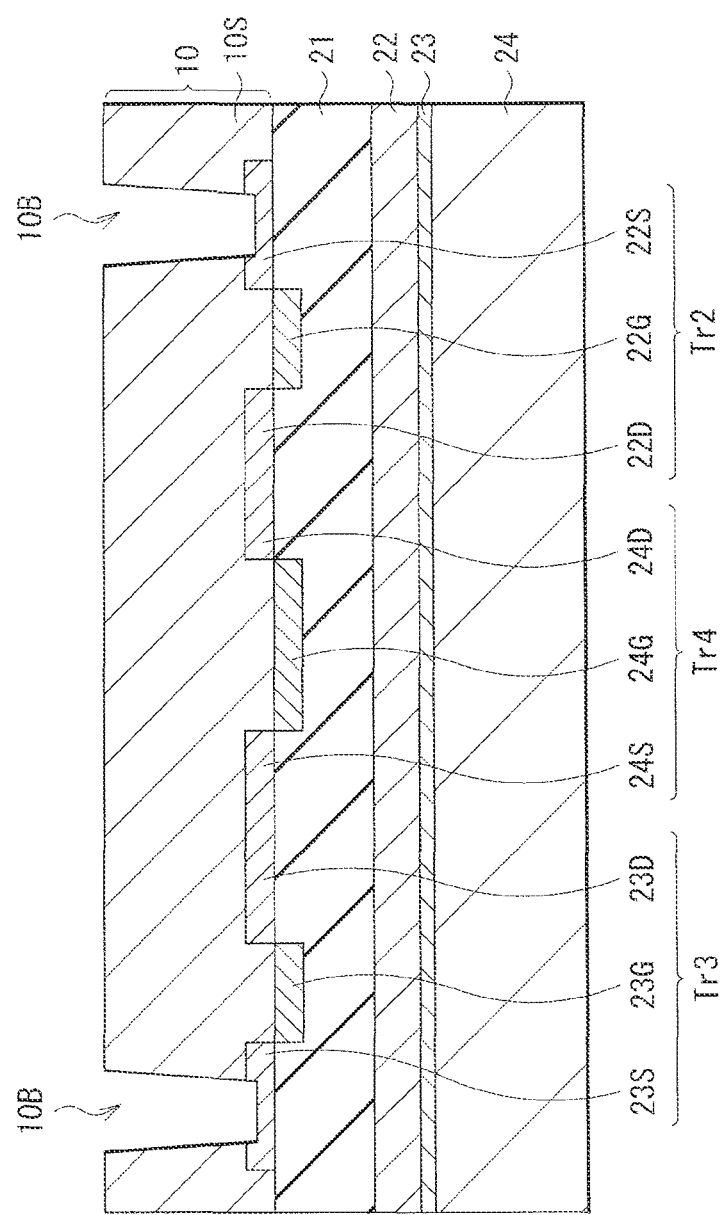
FIG. 17 is a diagram illustrating an example of a configuration of a cross-section of a portion, corresponding to the portion taken along the line B-B in FIG. 3, of the semiconductor layer shown in FIG. 16.

Subsequently, for example, one concave portion 10A and two concave portions 10B may be formed by patterning by a dry etching method (or by a wet etching method) using a photolithography method (FIGS. 16 and 17). At this time, the one concave portion 10A and the two concave portions 10B are formed to extend into part or whole of the bottom surface of the floating diffusion section FD and into part or whole of the bottom surfaces of the source regions 22S and 23S, respectively.

Subsequently, for example, the insulating film 25 may be formed on an entire surface including the one concave portion 10A and the two concave portions 10B. At this time, the insulating film 25 is formed to fill whole of inside of the one concave portion 10A and the two concave portions 10B (FIGS. 18 and 19). Thus, one insulating section 20 and two insulating sections 30 are formed. Subsequently, the light blocking film 26, the planarization film 27, the color filter 28, the on-chip lens 29, and the like are formed. Thus, the imaging device 1 is manufactured.

[Operation]

Next, an example of an operation of the imaging device 1 will be described. In the imaging device 1, first, the reset transistor Tr2 and the transfer transistor Tr1 are turned on. Accordingly, a potential of the floating diffusion section FD is reset to a potential of the power line VDD, and a predetermined voltage is applied to the photodiode PD. Subsequently, the reset transistor Tr2 is turned off and the transfer transistor Tr1 is turned on for a predetermined period. During such a period, for example, when external light enters the pixel region 11 via an optical member such as a lens, part of the incident light is subjected to photoelectric conversion in the photodiode PD, and electric charge of an amount in accordance with intensity of the incident light is accumulated in each of the pixels 12. The accumulated electric charge is collected on the transfer transistor Tr1 side by an electric field generated by a voltage applied to the pixel 12, and is tentatively accumulated in the floating diffusion section FD. Subsequently, when the transfer transistor Tr1 is turned off and the selection transistor Tr3 is turned on at a predetermined timing, the potential of the floating diffusion section FD is amplified, and a voltage in accordance with the amplified potential is outputted to the column processing circuit 14.

[Effects]

Next, effects of the imaging device 1 will be described. In the imaging device 1, the insulating sections 20 and 30 extend into part or whole of the bottom surface 10E of the floating diffusion section FD and into part or whole of the bottom surfaces 10G of the source regions 22S and 23S, respectively. The p-n junction does not exist in portions, in the floating diffusion section FD and the source regions 22S and 23S, into which the insulating sections 20 and 30 extend. Therefore, compared to a case where the insulating section 20 or 30 is not formed, an area of the p-n junction region formed on the bottom surface of the floating diffusion section FD and on the bottom surfaces of the source regions 22S and 23S are reduced in accordance with the portions into which the insulating sections 20 and 30 extend. As a result, it is possible to effectively suppress the p-n junction capacity at the bottom surface of the floating diffusion section FD and at the bottom surfaces of the source regions 22S and 23S.

Defects may concentrate near the ends of the bottom surfaces of the concave portions 10A and 10B in the semiconductor layer 10. In this case, a leakage current may flow as a result of the defects. When the ends of the bottom surfaces of the concave portions 10A and 10B are formed to avoid the depletion regions 10D and 10H in the present embodiment, it is possible to avoid defects in image quality (white spots) resulting from the leakage current, to suppress increase in an operation current resulting from a dark current, etc.

Moreover, when the concave portion 10A is in contact with the metal layer CM in the present embodiment, time of completion of etching the concave portion 10A is estimated by detecting a component of the metal layer CM in gas flow in the process of manufacturing the concave portion 10A. Similarly, when the concave portions 10A and 10B are in contact with the insulating layers 10F and 10J, respectively, in the present embodiment, time of completion of etching the concave portions 10A and 10B is estimated by detecting components of the insulating layers 10F and 10J in gas flow in the process of manufacturing the concave portion 10A. Moreover, also when the concave portion 10B is in contact with the interlayer insulating film 21 in the present embodiment, time of completion of etching the concave portion 10B is estimated by detecting a component of the interlayer insulating film 21 in gas flow in the process of manufacturing the concave portion 10B.

2. Modifications

Next, modifications of the imaging device 1 of the above-described embodiment will be described.

2.1 First Modification

Configuration

Figure 20:
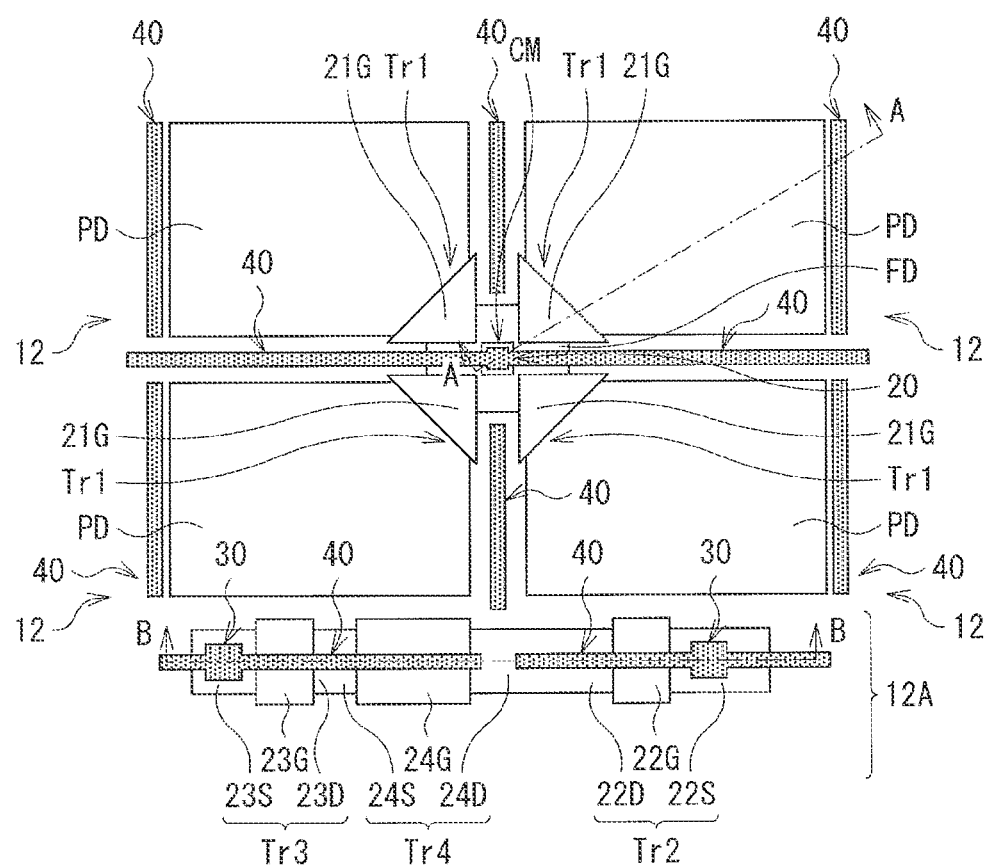
FIG. 20 is a diagram illustrating an example of an in-plane layout of a pixel in an imaging device according to a first modification.
Figure 21:
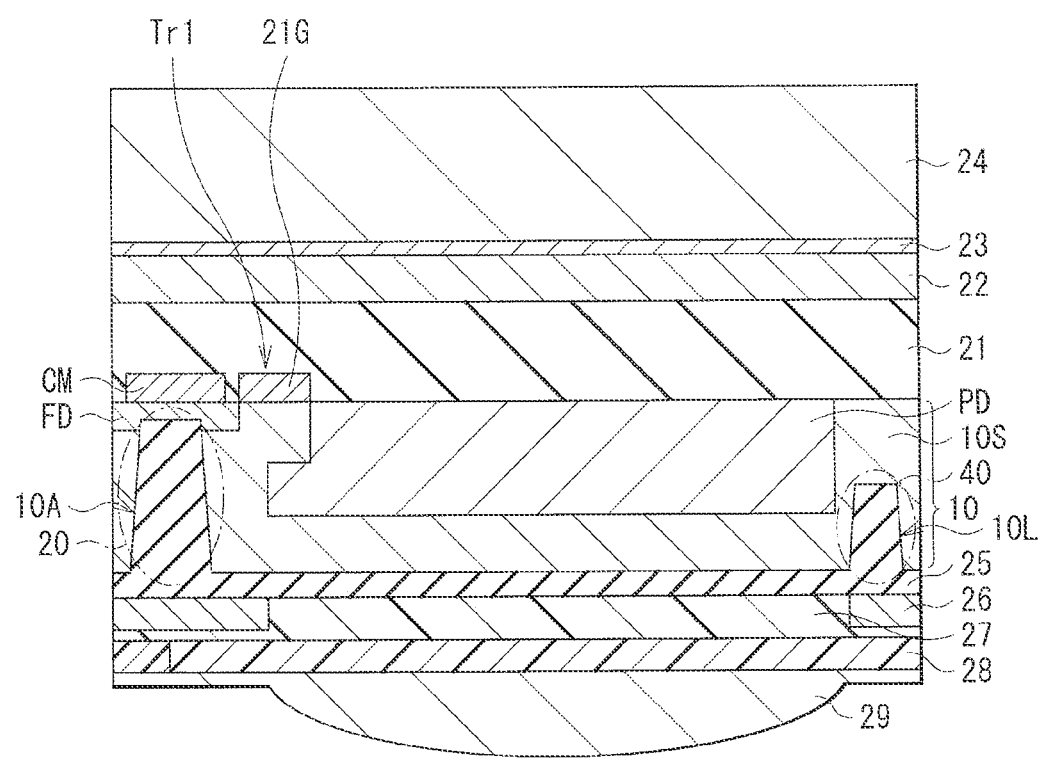
FIG. 21 is a diagram illustrating an example of a cross-sectional configuration taken along a line A-A in FIG. 20 and viewed from a direction of its arrows.
Figure 22:
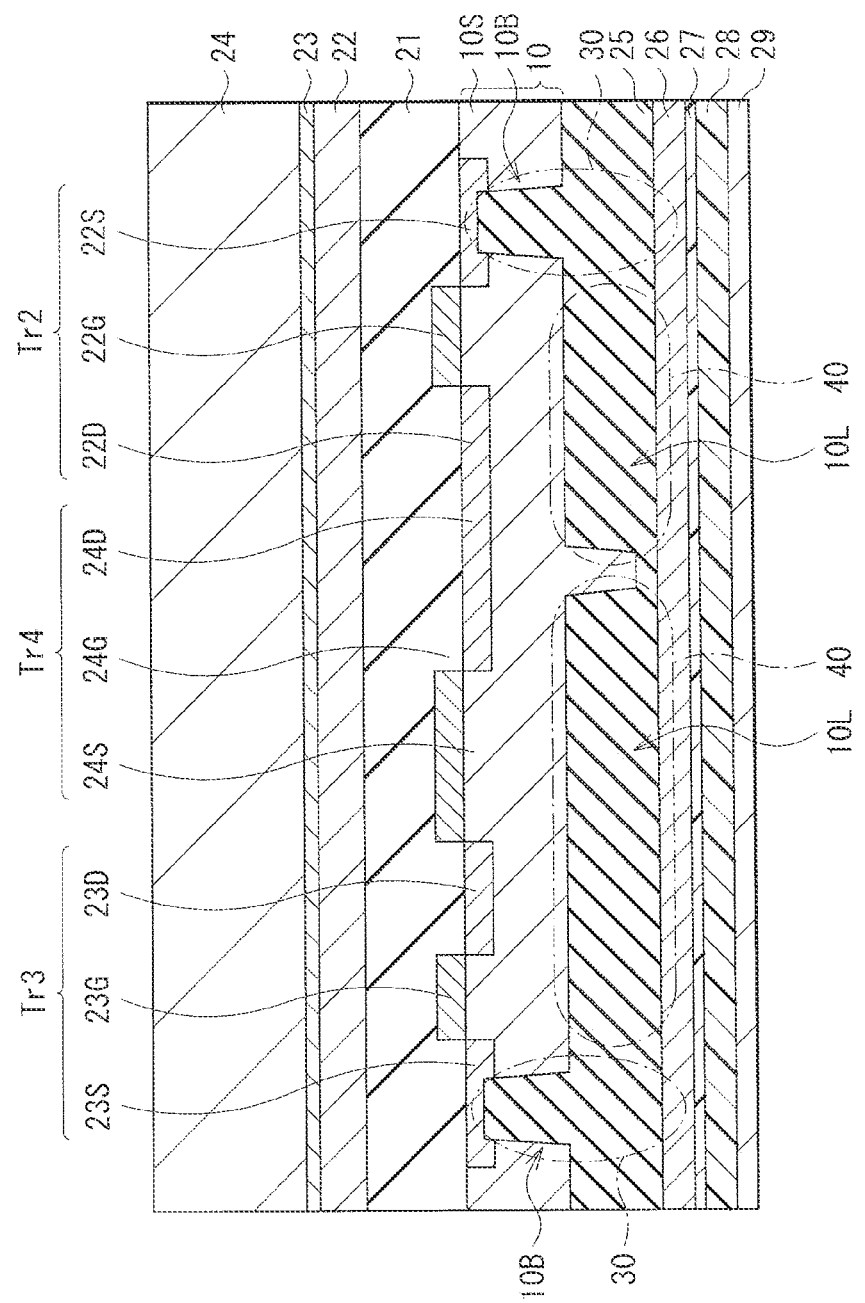
FIG. 22 is a diagram illustrating an example of a cross-sectional configuration taken along a line B-B in FIG. 20 and viewed from a direction of its arrows.

FIG. 20 illustrates an example of an in-plane layout of the pixel 12 in the imaging device 1 according to a first modification. FIG. 21 illustrates an example of a configuration of a cross-section taken along a line A-A shown in FIG. 20. FIG. 22 illustrates an example of a configuration of a cross-section taken along a line B-B shown in FIG. 20. FIG. 20 illustrates an example of the in-plane layout of the pixels 12 in a case where the reading circuit 12A is shared by four pixels 12. The in-plane layout of the pixels 12 is not limited to that shown in FIG. 20. The in-plane layout of the four pixels 12 that share the reading circuit 12A is not limited to that shown in FIG. 20.

The imaging device 1 according to the present modification includes, together with the insulating sections 20 and 30, separation grooves 40 that each insulate between two adjacent photodiodes PD to separate them. The separation groove 40 includes a groove portion 10L that is formed in the PD separation layer 10S in the semiconductor layer 10. The groove portion 10L is formed by etching the semiconductor layer 10 from its back surface as will be described later. The separation groove 40 includes a filling layer that fills whole of inside of the groove portion 10L. This filling layer is formed by filling the whole of the inside of the groove portion 10L with the insulating film 25.

As shown in FIG. 21, for example, the groove portion 10L may have a depth shallower than the depths of the concave portions 10A and 10B, and may have a width smaller than the widths of the concave portions 10A and 10B. As shown in FIGS. 21 and 22, the groove portion 10L is connected to the concave portion 10A or 10B. Therefore, in a structure in which the groove portion 10L is connected to the concave portion 10A, a width of the structure is relatively larger in the concave portion 10A and is relatively smaller in the groove portion 10L. Similarly, in a structure in which the groove portion 10L is connected to the concave portion 10B, a width of the structure is relatively larger in the concave portion 10B and is relatively smaller in the groove portion 10L.

Also, the separation groove 40 is connected with the insulating section 20 or 30. Therefore, in a structure in which the separation groove 40 is connected to the insulating section 20, a width of the structure is relatively larger in the insulating section 20 and is relatively smaller in the separation groove 40. Similarly, in a structure in which the separation groove 40 is connected to the insulating section 30, a width of the structure is relatively larger in the insulating section 30 and is relatively smaller in the separation groove 40.

[Manufacturing Method]

Figure 23:
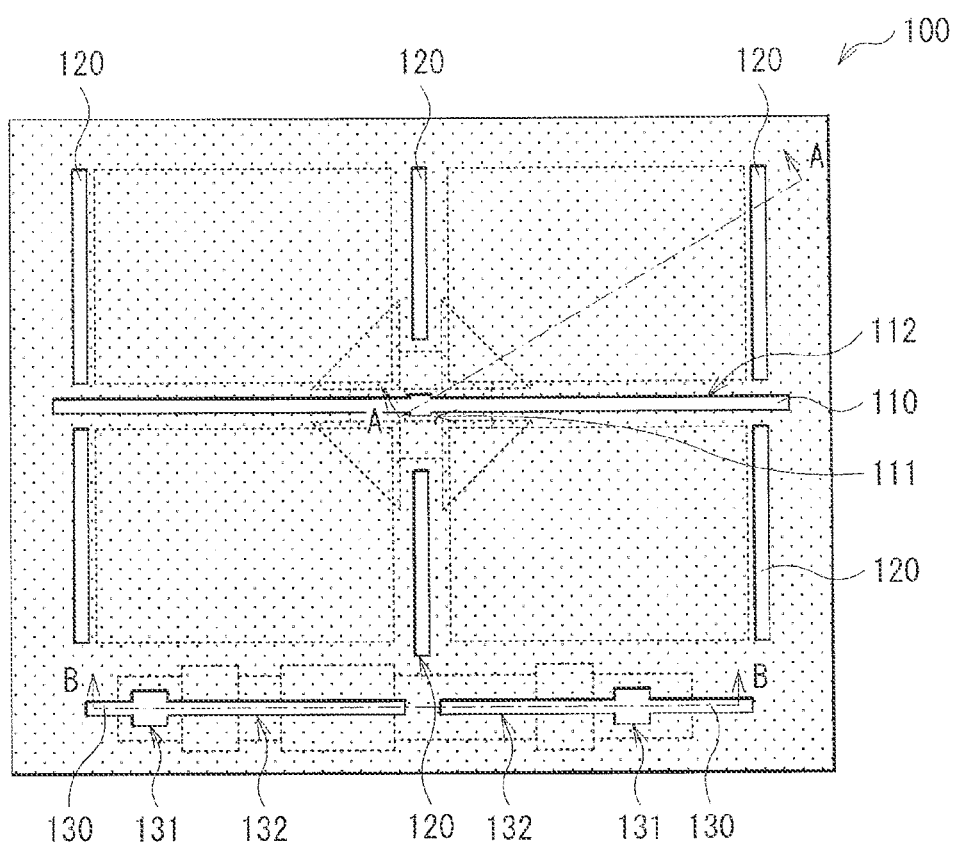
FIG. 23 is a diagram illustrating an example of a step of manufacturing the imaging device according to the first modification in an in-plane layout.
Figure 24:
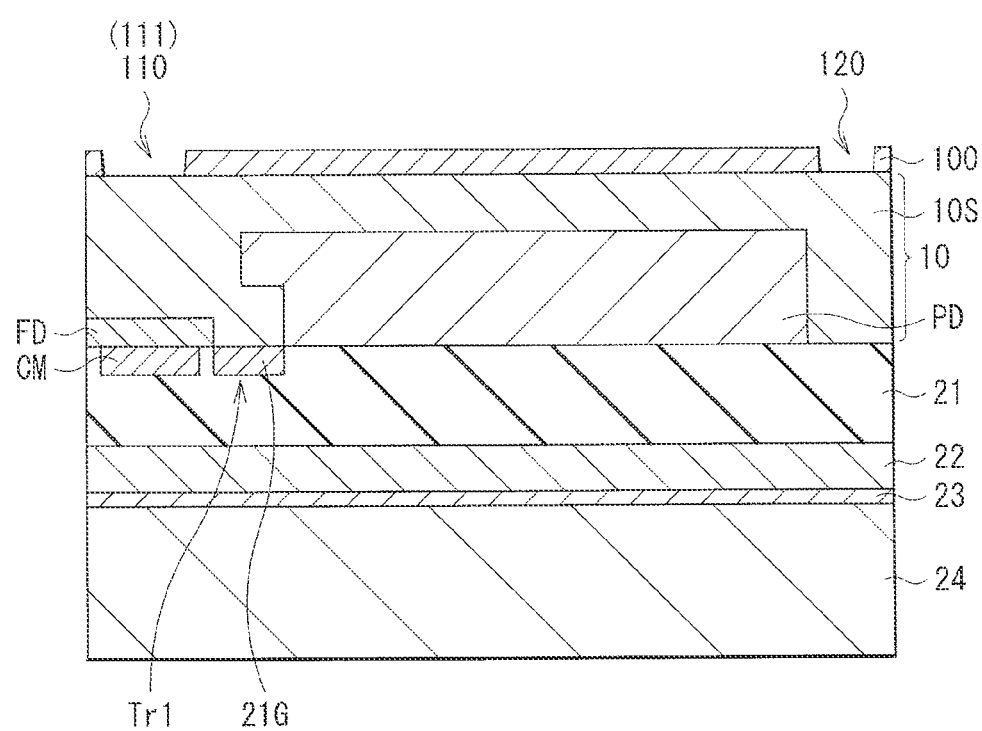
FIG. 24 is a diagram illustrating an example of a cross-sectional configuration taken along a line A-A in FIG. 23 and viewed from a direction of its arrows.
Figure 25:
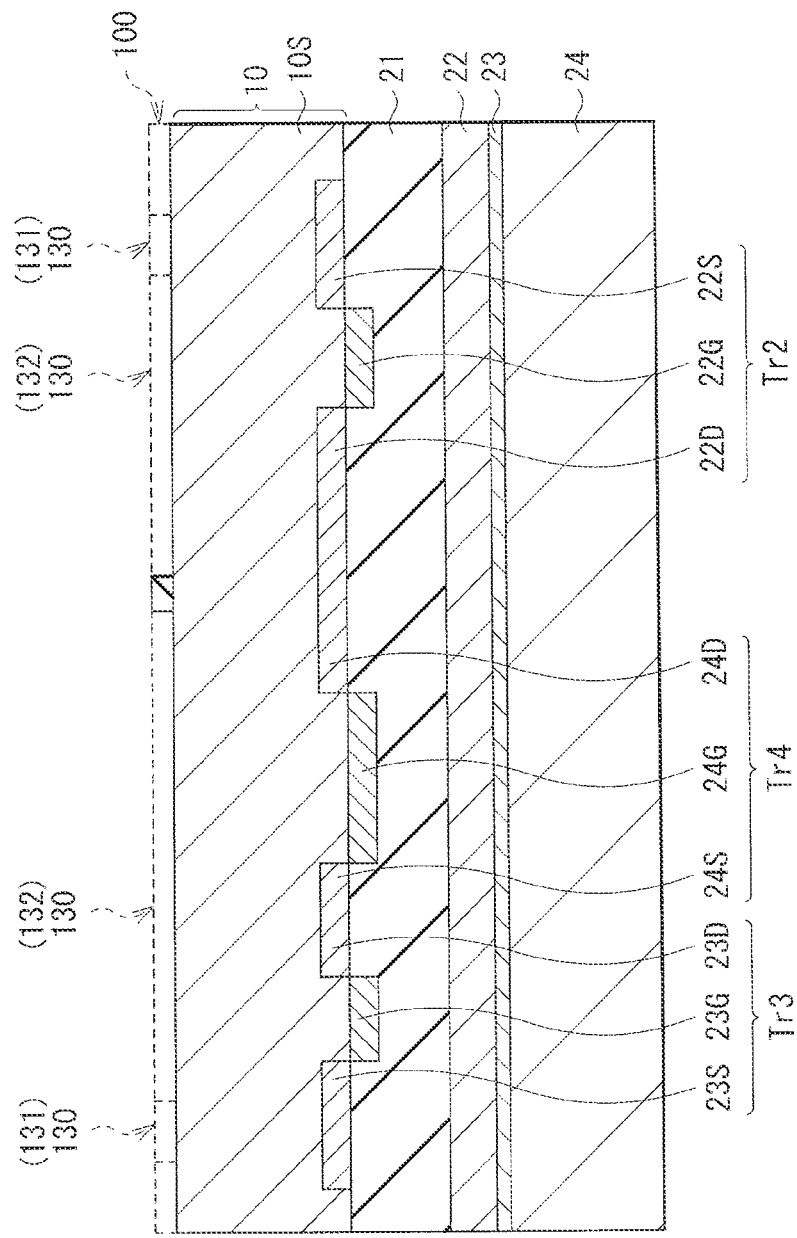
FIG. 25 is a diagram illustrating an example of a cross-sectional configuration taken along a line B-B in FIG. 23 and viewed from a direction of its arrows.
Figure 26:
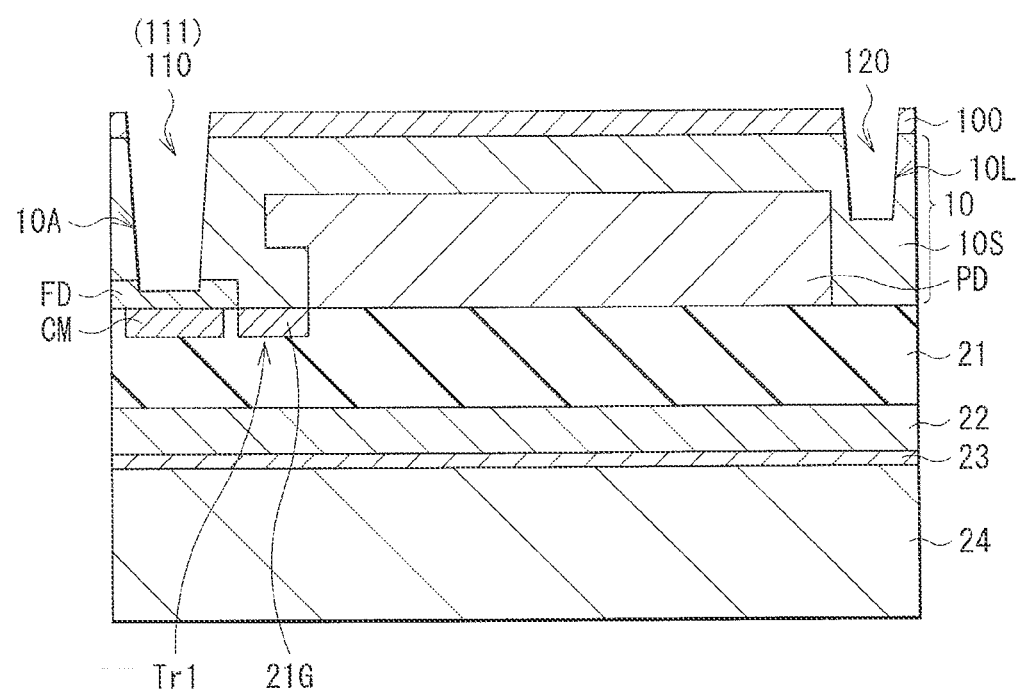
FIG. 26 is a diagram illustrating an example of a manufacturing step following the step shown in FIG. 24 with the use of a cross-section of the portion corresponding to the portion along the line A-A in FIG. 23.
Figure 27:
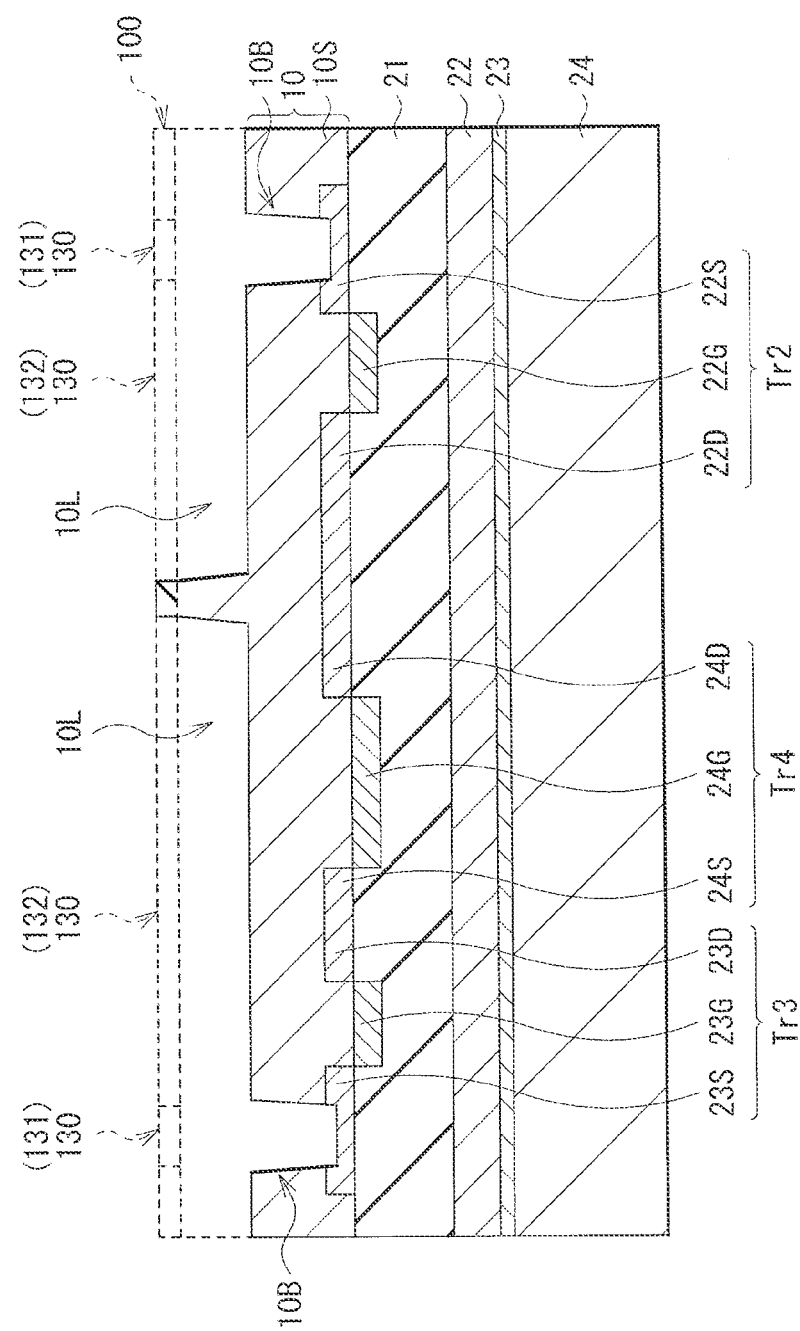
FIG. 27 is a diagram illustrating an example of a configuration of a cross-section of a portion, corresponding to the portion taken along the line B-B in FIG. 23, of the semiconductor layer shown in FIG. 26.
Figure 28:
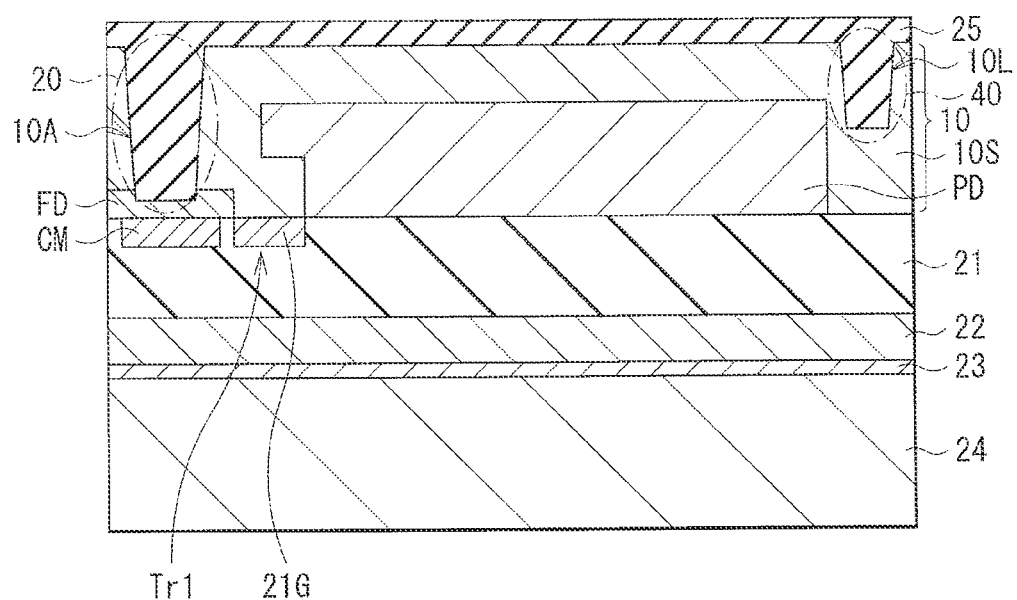
FIG. 28 is a diagram illustrating an example of a manufacturing step following the step shown in FIG. 26 with the use of a cross-section of the portion corresponding to the portion taken along the line A-A in FIG. 23.
Figure 29:
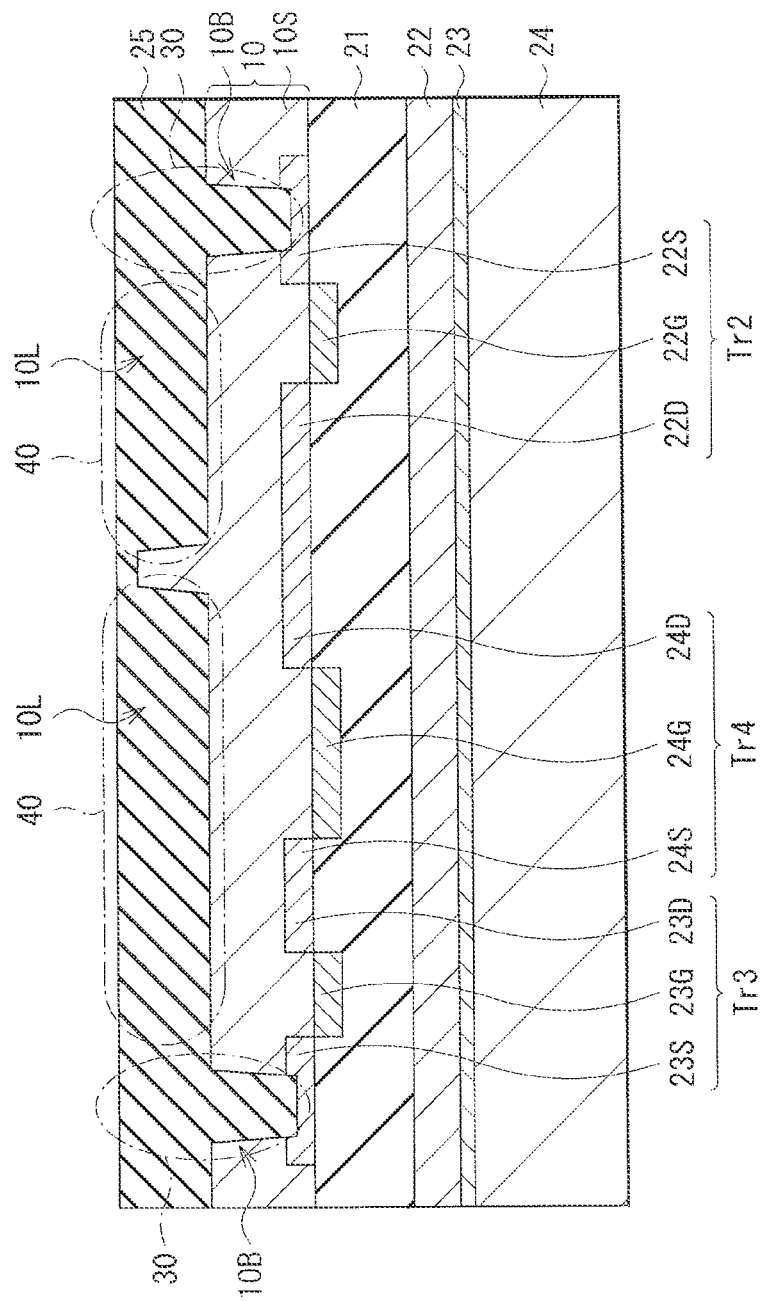
FIG. 29 is a diagram illustrating an example of a configuration of a cross-section of a portion, corresponding to the portion taken along the line B-B in FIG. 23, of the semiconductor layer shown in FIG. 28.

Next, description will be provided of an example of a method of manufacturing the imaging device 1 according to the present modification. FIGS. 23 to 29 illustrate a process of manufacturing the imaging device 1 according to the present modification in order. FIG. 23 illustrates an example of a step of manufacturing the imaging device 1 with the use of an in-plane layout. FIGS. 24, 26, and 28 each illustrate an example of a cross-section of a portion corresponding to a portion taken along a line A-A in FIG. 23. FIGS. 25, 27, and 29 each illustrate an example of a configuration of a cross-section of a portion corresponding to the portion taken along the line B-B in FIG. 23.

First, the pixel substrate 80 is prepared (see FIGS. 12 and 13). Subsequently, for example, the back surface (the semiconductor substrate 10W) of the pixel substrate 80 may be etched, for example, by a dry etching method (or by a wet etching method) to reduce the thickness of the semiconductor substrate 10W to a predetermined thickness (see FIGS. 14 and 15).

Subsequently, for example, after a resist layer is applied on the entire surface, the resist layer is patterned by a dry etching method (or a wet etching method) using a photolithography method to form a mask 100 that includes openings 110, 120, and 130 (FIGS. 23, 24, and 25). The opening 110 is provided in a region that is located between two adjacent photodiodes PD and extends through a portion directly above the floating diffusion section FD. The opening 110 has a belt-like shape. Further, the opening 110 has a wide width portion 111 having a relatively-wide width in a portion that corresponds to the portion directly above the floating diffusion region FD, and has a narrow width portion 112 having a relatively-narrow width in other portions. The opening 120 is provided in a portion that is located between two adjacent photodiodes PD and does not extend through the portion directly above the floating diffusion section FD. The opening 120 has a belt-like shape that has a width same as that of the narrow width portion 112. The opening 130 is provided directly above the reset transistor Tr2, the selection transistor Tr3, or the amplifier transistor Tr4. The opening 130 has a belt-like shape. Further, the opening 130 has a wide width portion 131 having a relatively-wide width in a portion that corresponds to a portion directly above the source region 22S or 23S, and has a narrow width portion 132 having a relatively-narrow width in other portion.

Subsequently, for example, the semiconductor layer 10 may be selectively etched with the mask 100 in between. Thus, the concave portion 10A is formed in a portion corresponding to the wide width portion 111, and the concave portion 10B is formed in a portion corresponding to the wide width portion 131 (FIGS. 26 and 27). Moreover, the groove portions 10L are formed in portions corresponding to the openings 120, the narrow width portions 112, and the narrow width portions 132 (FIGS. 26 and 27). At this time, the concave portion 10A and the concave portion 10B are so formed as to extend into part or whole of the bottom surface of the floating diffusion section FD and the bottom surface of the source region 22S or 23S, respectively. Moreover, the groove portion 10L is so formed as not to be in contact with the floating diffusion section FD, the transfer transistor Tr1, and the reading circuit 12A.

The wide width portions 111 and 131 have opening widths larger than those of the narrow width portions 112 and 132. Therefore, even if the same conditions are set for dry etching (or wet etching), the semiconductor layer 10 is allowed to be etched deeper in the wide width portions 111 and 131 than in the narrow width portions 112 and 132. Therefore, the dry etching (or the wet etching) may be ended at a timing when the concave portions 10A and 10B have extended into the bottom surface of the floating diffusion section FD and the bottom surface of the source region 22S or 23S, respectively.

Subsequently, for example, the insulating film 25 may be formed on an entire surface that includes the concave portions 10A and 10B and the groove portions 10L. At this time, the insulating film 25 is so formed as to fill whole of the inside of the concave portions 10A and 10B and the groove portions 10L (FIGS. 28 and 29). Thus, the insulating sections 20 and 30 and the plurality of separation grooves 40 are formed. Subsequently, the light blocking film 26, the planarization film 27, the color filter 28, the on-chip lens 29, etc. are formed. Thus, the imaging device 1 according to the present modification is manufactured.

[Effects]

Next, effects of the imaging device 1 according to the present modification will be described. In the imaging device 1, the concave portions 10A and 10B and the groove portions 10L are formed concurrently by selectively etching the semiconductor layer 10 with the mask 100 that have openings with different widths in between. Accordingly, it is possible to form the insulating sections 20 and 30 that reduce the p-n junction capacity without increasing the number of manufacturing steps in the imaging device 1 that includes the separation grooves 40 for device separation.

Moreover, in the imaging device 1 according to the present modification, the positions of the wide width portions 111 and 131 in the mask 100 is allowed to be set relatively freely. Therefore, it is possible to concurrently form the separation grooves 40 for device separation and the insulating sections 20 and 30 that reduce the p-n junction capacity while securing the degree of freedom in the in-plane layout of the pixels 12.

2.2 Second Modification

Configuration

Figure 30:
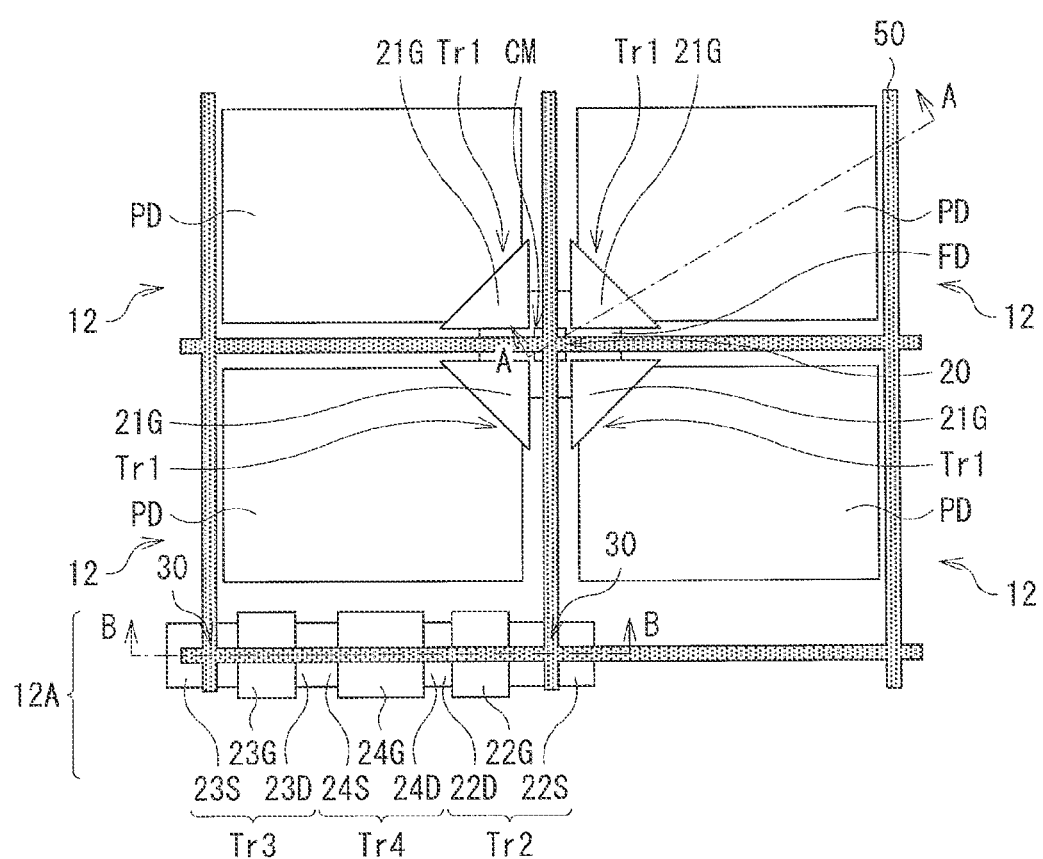
FIG. 30 is a diagram illustrating an example of an in-plane layout of a pixel in an imaging device according to a second modification.
Figure 31:
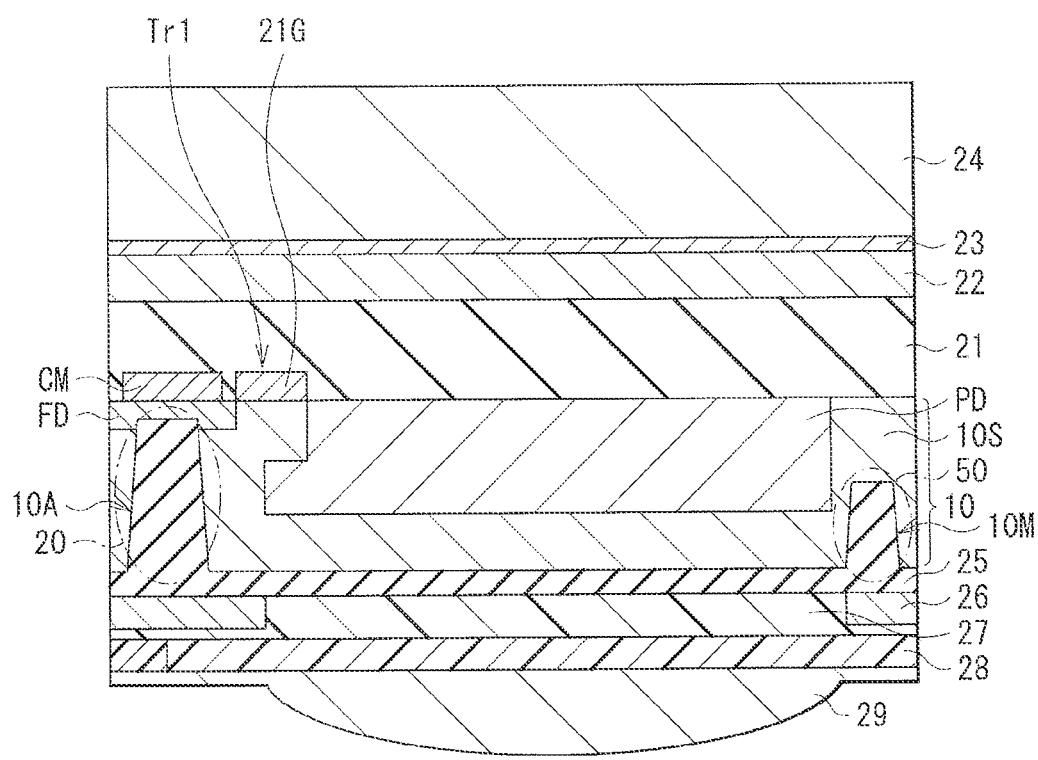
FIG. 31 is a diagram illustrating an example of a cross-sectional configuration taken along a line A-A in FIG. 30 and viewed from a direction of its arrows.
Figure 32:
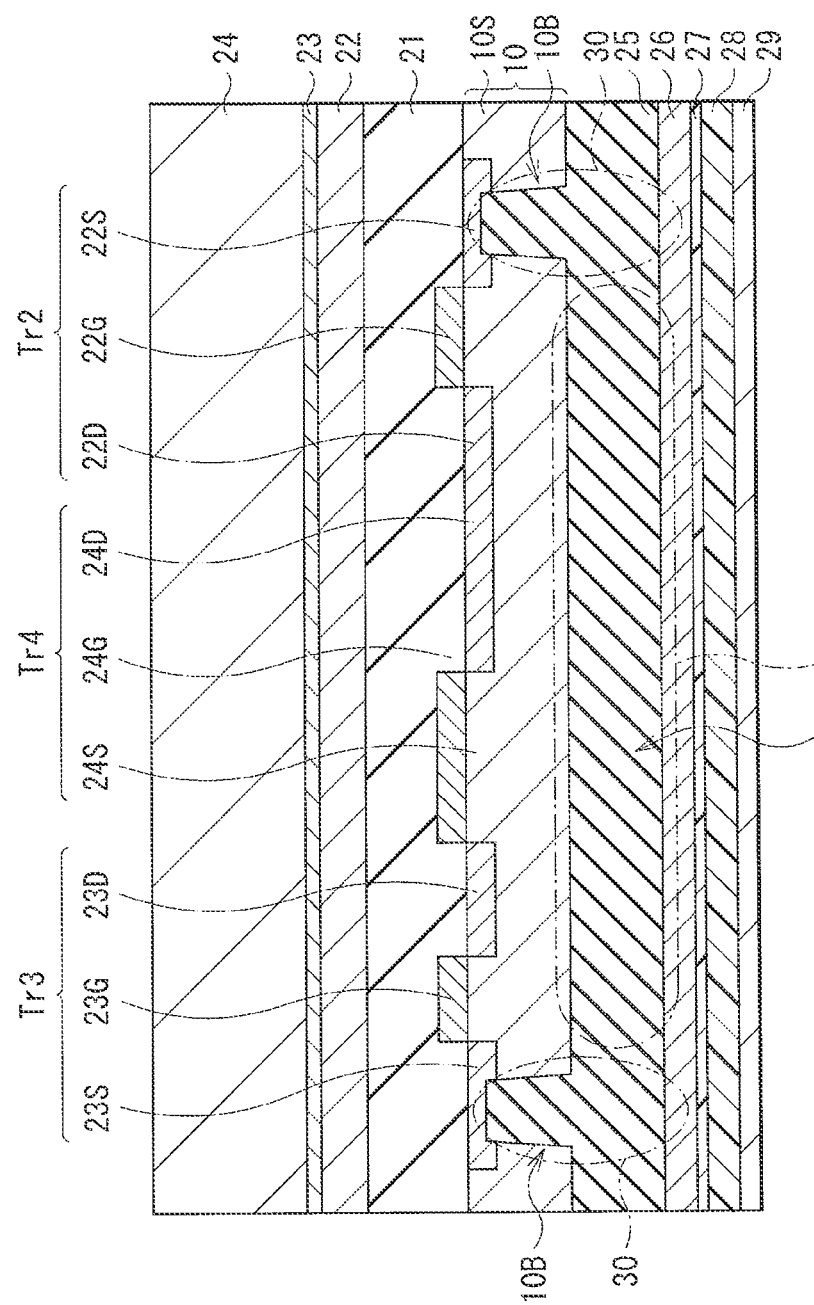
FIG. 32 is a diagram illustrating an example of a cross-sectional configuration taken along a line B-B in FIG. 30 and viewed from a direction of its arrows.

FIG. 30 illustrates an example of an in-plane layout of the pixel 12 in the imaging device 1 according to a second modification. FIG. 31 illustrates an example of a configuration of a cross-section taken along a line A-A shown in FIG. 30. FIG. 32 illustrates an example of a configuration of a cross-section taken along a line B-B shown in FIG. 30. FIG. 30 illustrates an example of the in-plane layout of the pixels 12 in a case where the reading circuit 12A is shared by four pixels 12. The in-plane layout of the pixels 12 is not limited to that shown in FIG. 30. The in-plane layout of the four pixels 12 that share the reading circuit 12A is not limited to that shown in FIG. 30.

The imaging device 1 according to the present modification includes, together with the insulating sections 20 and 30, separation grooves 50 that each insulate between two adjacent photodiodes PD to separate them. The separation groove 50 includes a groove portion 10M that is formed in the PD separation layer 10S in the semiconductor layer 10. The groove portion 10M is formed by etching the semiconductor layer 10 from its back surface as will be described later. The groove portion 10M has a lattice-like shape, and part of a plurality of portions corresponding to intersections of the lattice each configure the above-described concave portion 10A or 10B. The separation groove 50 includes a filling layer that fills whole of inside of the groove portion 10M. This filling layer is formed by filling the whole of the inside of the groove portion 10M with the insulating film 25.

As shown in FIG. 31, for example, the groove portion 10M may have a depth shallower than the depths of the concave portions 10A and 10B, and may have a width almost the same as the widths of the concave portions 10A and 10B. As shown in FIGS. 31 and 32, the groove portion 10M is connected to the concave portion 10A or 10B at the intersection in the groove portion 10M. Therefore, in a structure in which the groove portion 10M is connected to the concave portion 10A or 10B, a width of the structure is uniform in any portion. Moreover, the separation groove 50 is connected to the insulating section 20 or 30 at an intersection in the separation groove 50. Therefore, in a structure in which the separation groove 50 is connected to the insulating section 20 or 30, a width of the structure is uniform in any portion.

[Manufacturing Method]

Figure 33:
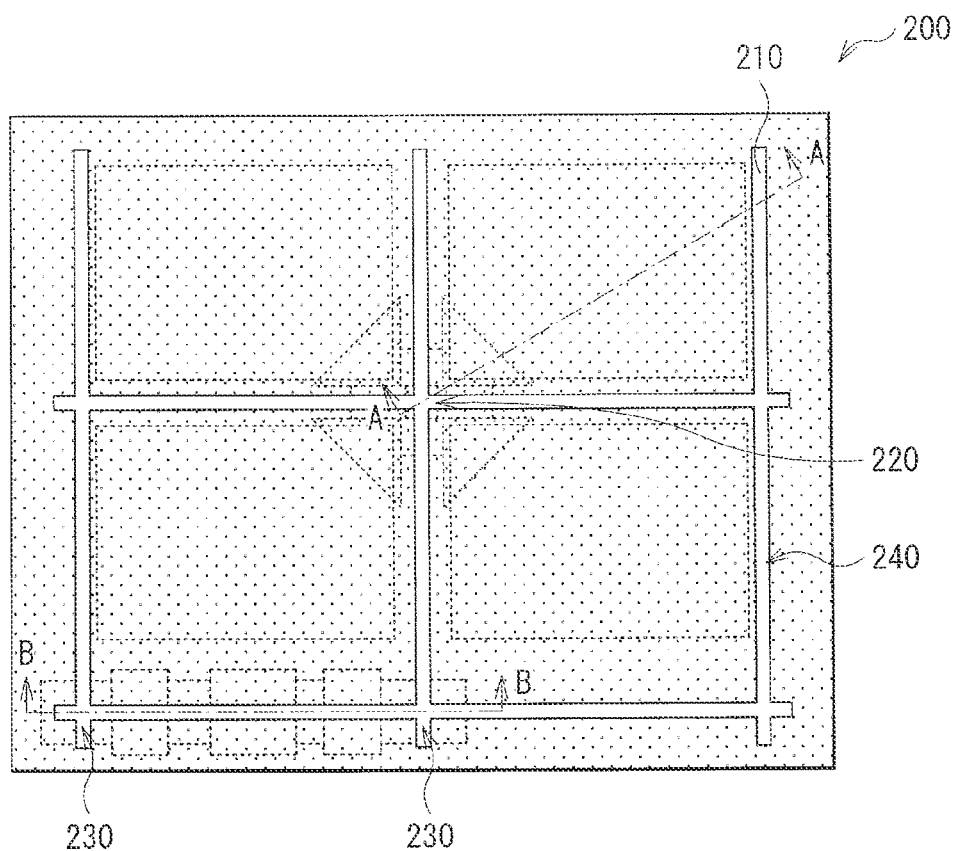
FIG. 33 is a diagram illustrating an example of a step of manufacturing the imaging device according to the second modification in an in-plane layout.
Figure 34:
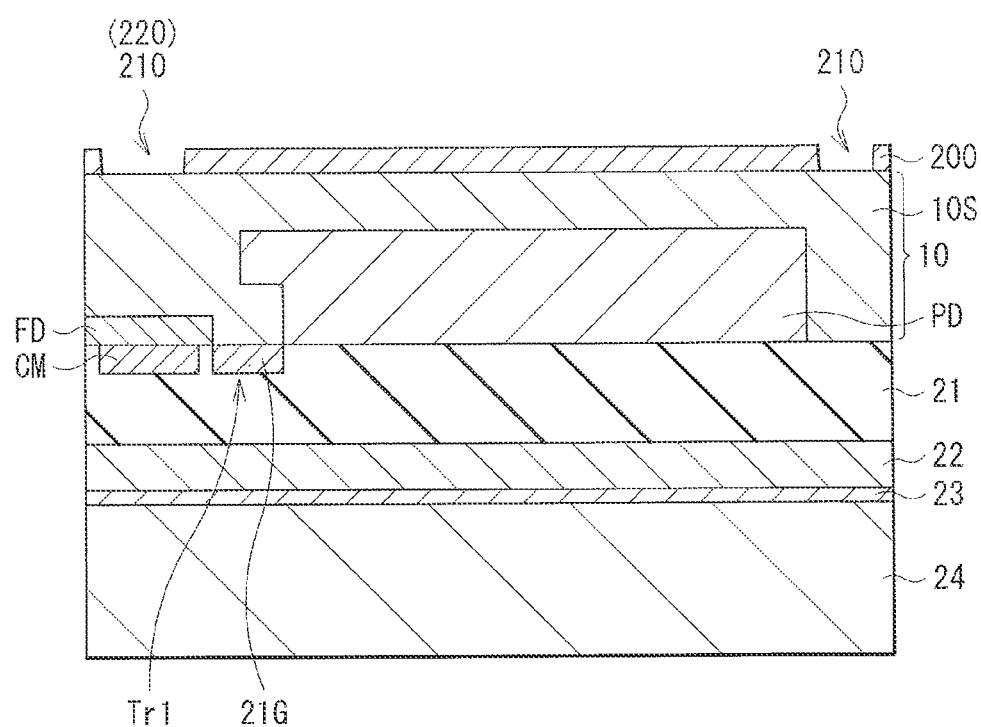
FIG. 34 is a diagram illustrating an example of a cross-sectional configuration taken along a line A-A in FIG. 33 and viewed from a direction of its arrows.
Figure 35:
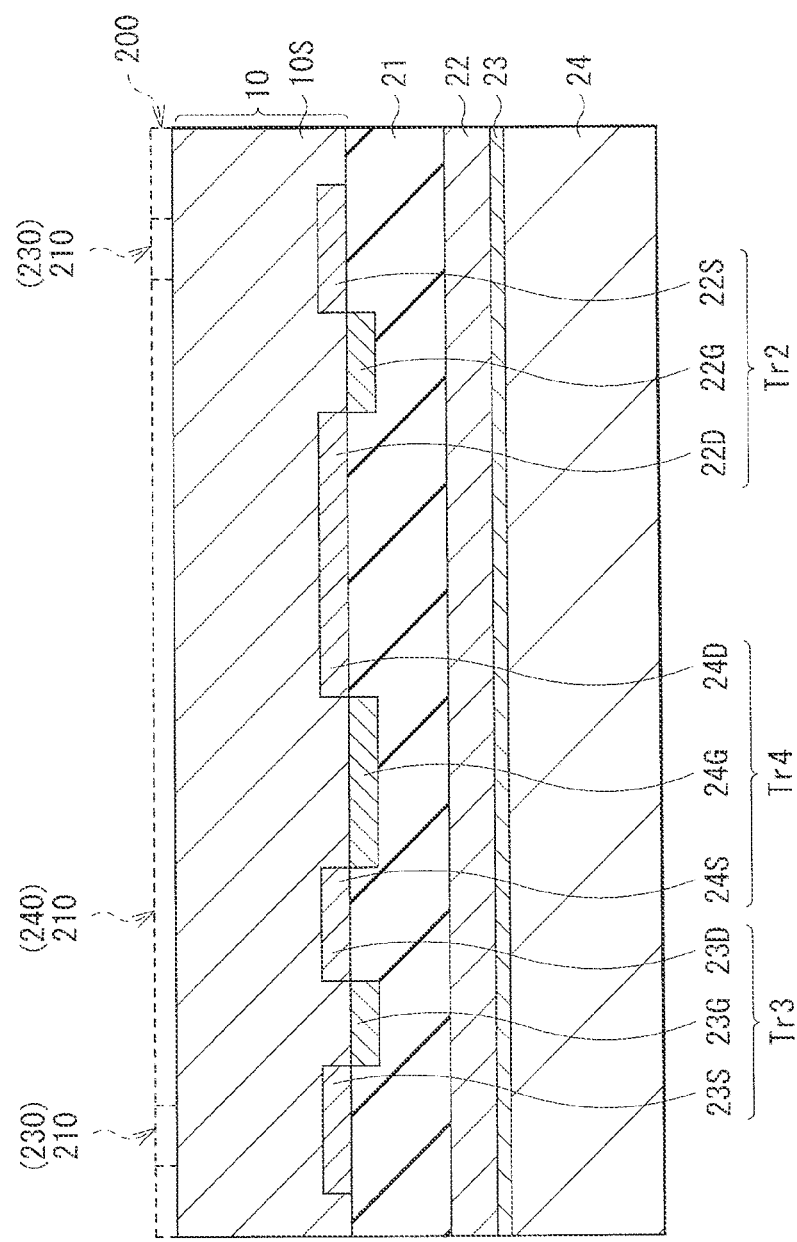
FIG. 35 is a diagram illustrating an example of a cross-sectional configuration taken along a line B-B in FIG. 33 and viewed from a direction of its arrows.
Figure 36:
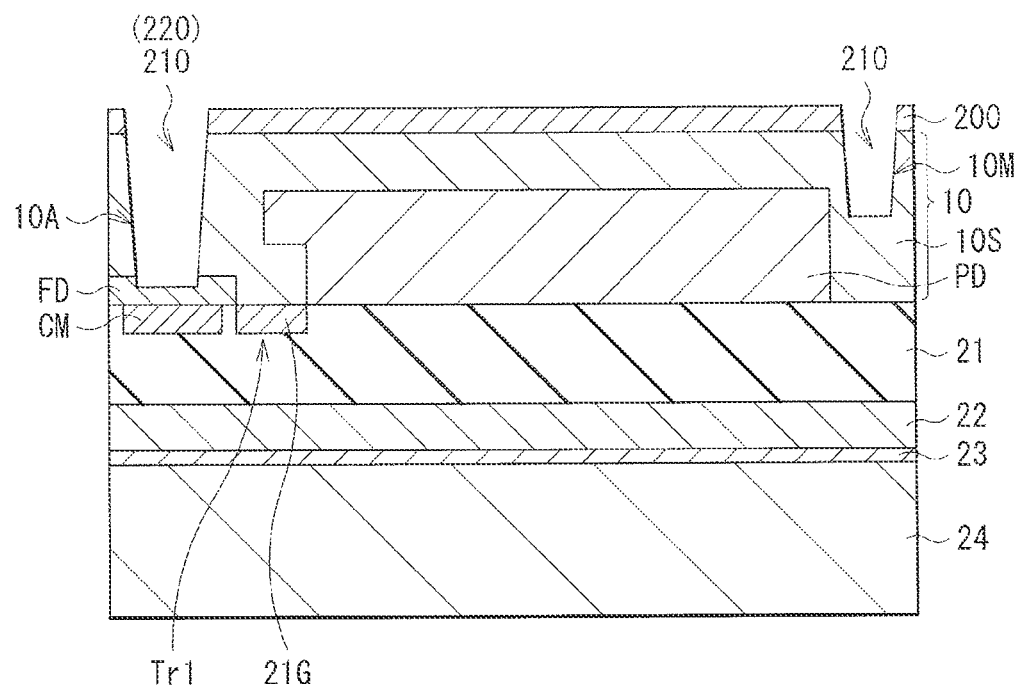
FIG. 36 is a diagram illustrating an example of a manufacturing step following the step shown in FIG. 34 with the use of a cross-section of the portion corresponding to the portion along the line A-A in FIG. 33.
Figure 37:
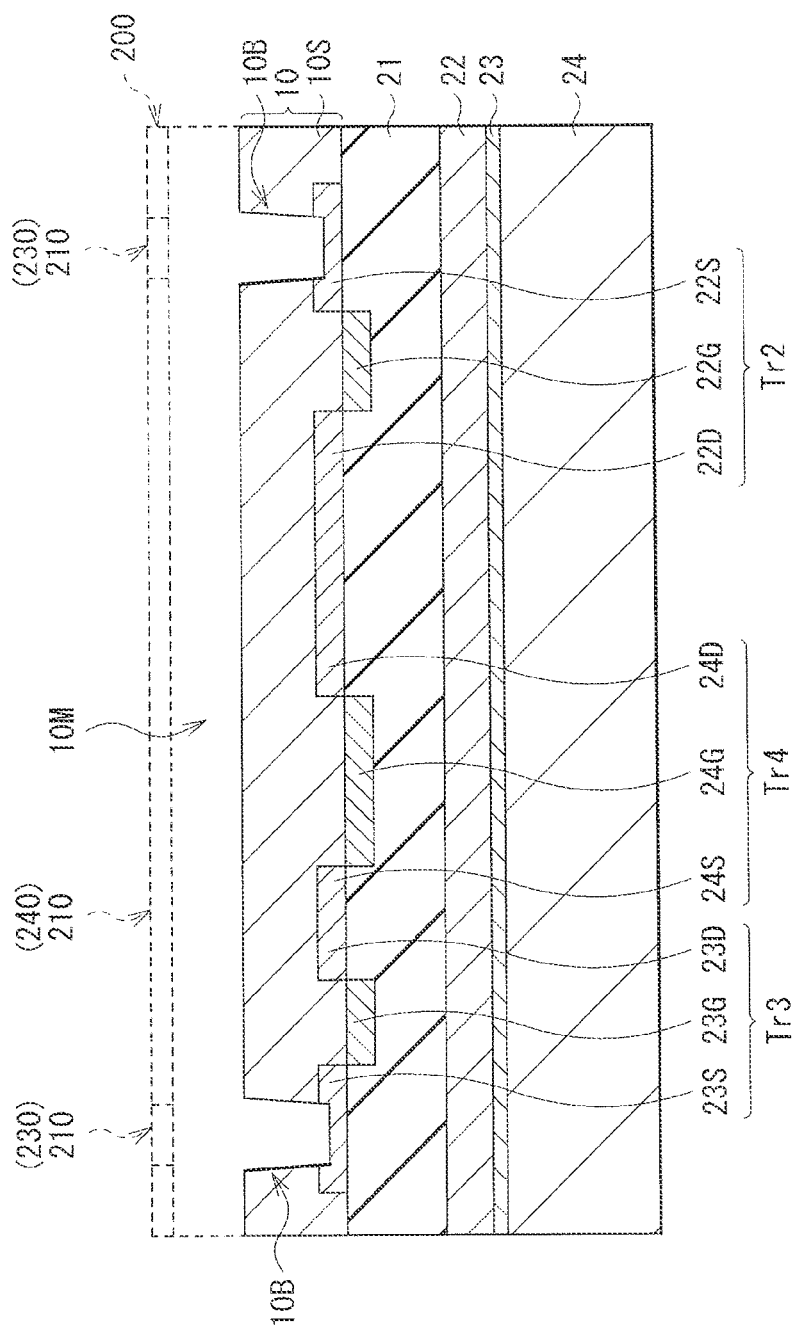
FIG. 37 is a diagram illustrating an example of a configuration of a cross-section of a portion, corresponding to the portion taken along the line B-B in FIG. 33, of the semiconductor layer shown in FIG. 36.
Figure 38:
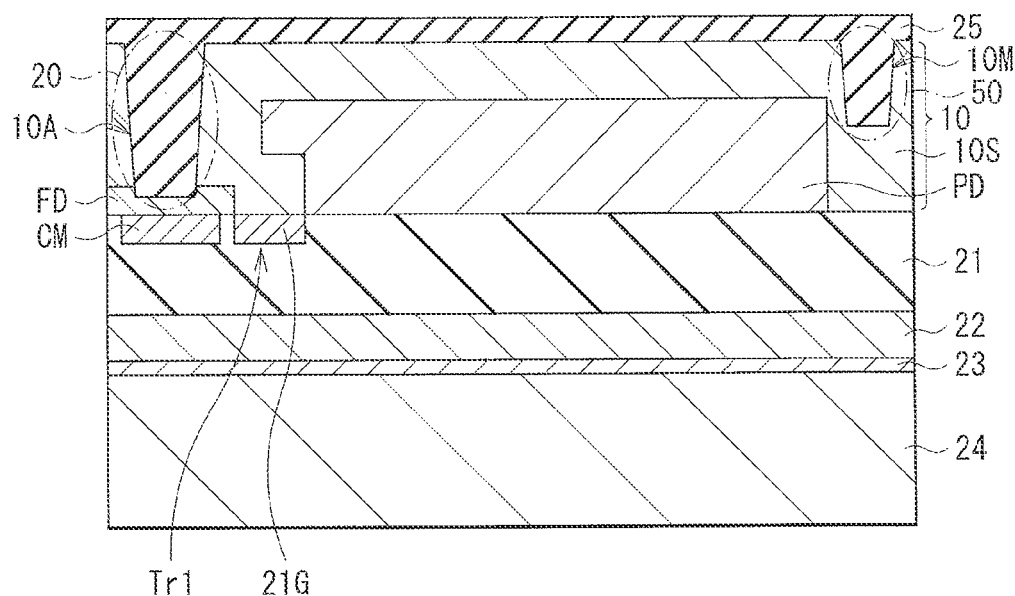
FIG. 38 is a diagram illustrating an example of a manufacturing step following the step shown in FIG. 36 with the use of a cross-section of the portion corresponding to the portion taken along the line A-A in FIG. 33.
Figure 39:
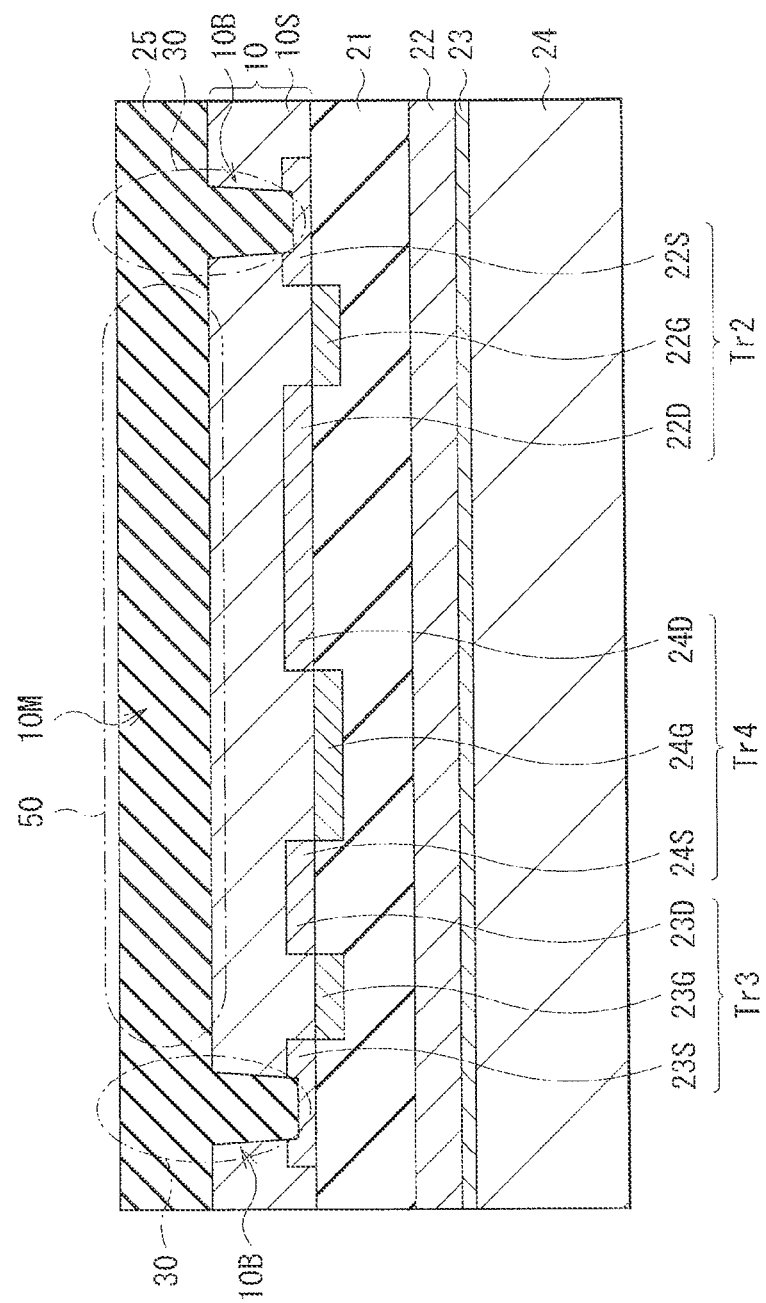
FIG. 39 is a diagram illustrating an example of a configuration of a cross-section of a portion, corresponding to the portion taken along the line B-B in FIG. 33, of the semiconductor layer shown in FIG. 38.

Next, description will be provided of an example of a method of manufacturing the imaging device 1 according to the present modification. FIGS. 33 to 39 illustrate a process of manufacturing the imaging device 1 according to the present modification in order. FIG. 33 illustrates an example of a step of manufacturing the imaging device 1 with the use of an in-plane layout. FIGS. 34, 36, and 38 each illustrate an example of a cross-section of a portion corresponding to a portion taken along a line A-A in FIG. 33. FIGS. 35, 37, and 39 each illustrate an example of a configuration of a cross-section of a portion corresponding to a portion taken along the line B-B in FIG. 33.

First, the pixel substrate 80 is prepared (see FIGS. 12 and 13). Subsequently, for example, the back surface (the semiconductor substrate 10W) of the pixel substrate 80 may be etched, for example, by a dry etching method (or by a wet etching method) to reduce the thickness of the semiconductor substrate 10W to a predetermined thickness (see FIGS. 14 and 15).

Subsequently, for example, after a resist layer is applied on the entire surface, the resist layer is patterned by a dry etching method (or by a wet etching method) using a photolithography method to form a mask 200 that includes an opening 210 (FIGS. 33, 34, and 35). The opening 210 is provided in a region that is located between two adjacent photodiodes PD and has a lattice-like shape. The opening 210 is provided in a region that extends through portions directly above the floating diffusion section FD, the reset transistor Tr2, the selection transistor Tr3, and the amplifier transistor Tr4. The opening 210 has a width that is uniform in any portion. One intersection region 220 of a plurality of intersection regions in the opening 210 is provided in a portion corresponding to the portion directly above the floating diffusion section FD. Two intersection regions 230 of the plurality of intersection regions in the opening 210 are provided in portions corresponding to the portions directly above the source regions 22S and 23S, one by one.

Subsequently, for example, the semiconductor layer 10 may be selectively etched with the mask 200 in between. Thus, the concave portion 10A is formed in a portion corresponding to the intersection region 220, and the concave portions 10B are formed in portions corresponding to the two intersection regions 230 (FIGS. 36 and 37). Moreover, the groove portions 10M are formed in portions (for example, in a linear region 240 shown in FIG. 33), of the opening 210, other than the intersection regions 220 and 230 (FIGS. 36 and 37). At this time, the concave portion 10A and the concave portions 10B are so formed as to extend into part or whole of the bottom surface of the floating diffusion section FD and part or whole of the bottom surfaces of the source region 22S and 23S, respectively. Moreover, the groove portion 10M is so formed as not to be in contact with the floating diffusion section FD, the transfer transistor Tr1, and the reading circuit 12A.

The intersection regions 220 and 230 have opening widths substantially larger than those of the portions, of the opening 210, other than the intersection regions. Therefore, even if the same conditions are set for dry etching (or wet etching), the semiconductor layer 10 is allowed to be etched deeper in the intersection regions 220 and 230 than in portions, of the opening 210, other than the intersection regions. Therefore, the dry etching (or the wet etching) may be ended at a timing when the concave portions 10A and 10B have extended into the bottom surface of the floating diffusion section FD and the bottom surfaces of the source regions 22S and 23S, respectively.

Subsequently, for example, the insulating film 25 may be formed on an entire surface that includes the concave portions 10A and 10B and the groove portion 10M. At this time, the insulating film 25 is so formed as to fill whole of the inside of the concave portions 10A and 10B and the groove portions 10M (FIGS. 38 and 39). Thus, the insulating sections 20 and 30 and the plurality of separation grooves 50 are formed. Subsequently, the light blocking film 26, the planarization film 27, the color filter 28, the on-chip lens 29, etc. are formed. Thus, the imaging device 1 according to the present modification is manufactured.

[Effects]

Next, effects of the imaging device 1 according to the present modification will be described. In the imaging device 1, the concave portions 10A and 10B and the groove portions 10M are formed concurrently by selectively etching the semiconductor layer 10 with the mask 200 that has the opening 210 having the lattice-like shape and a uniform width. Accordingly, it is possible to form the insulating sections 20 and 30 that reduce the p-n junction capacity without increasing the number of manufacturing steps in the imaging device 1 that includes the separation grooves 50 for device separation.

2.3 Third Modification

Figure 40:
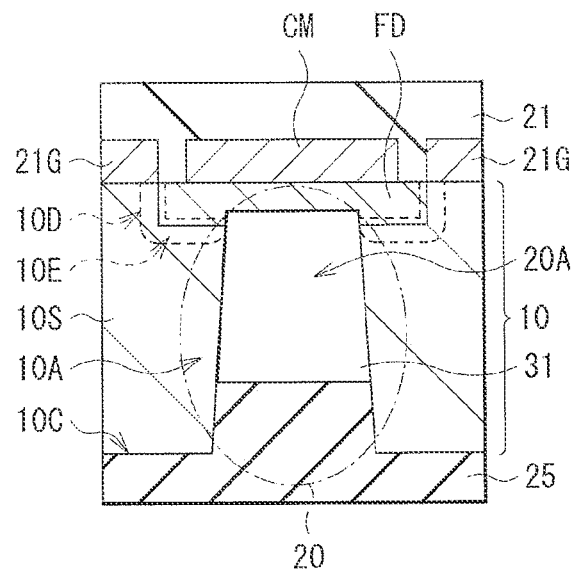
FIG. 40 is a diagram illustrating an example of a cross-sectional configuration of an insulating section and a periphery thereof in an imaging device according to a third modification.
Figure 41:
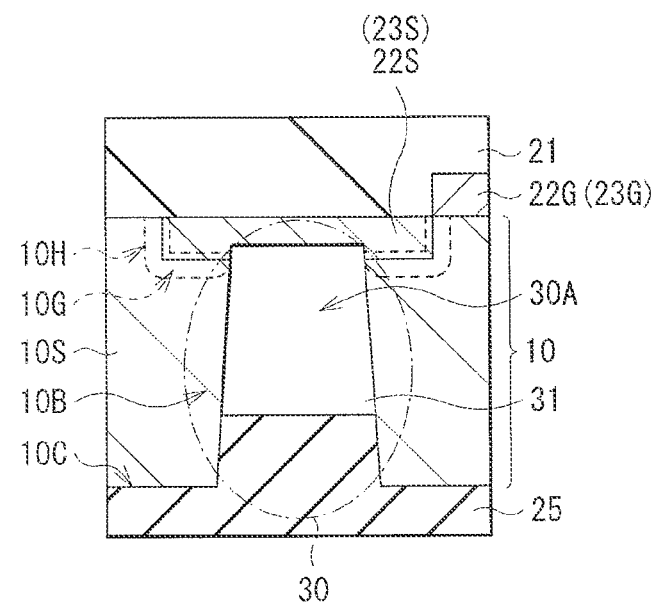
FIG. 41 is a diagram illustrating another example of the cross-sectional configuration of the insulating section and the periphery thereof in the imaging device according to the third modification.
Figure 42:
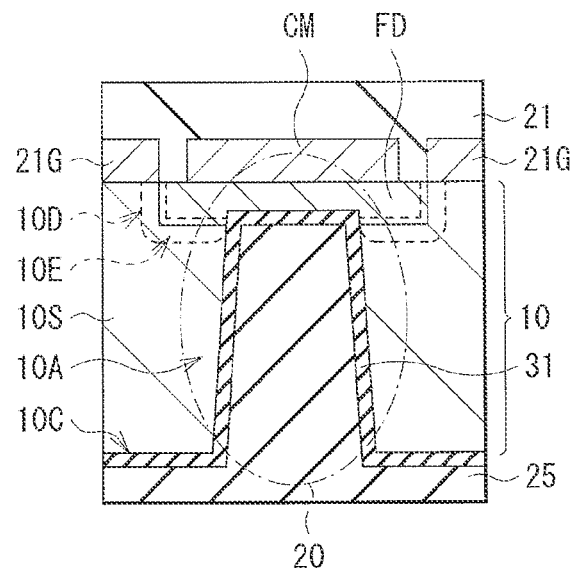
FIG. 42 is a diagram illustrating an example of a cross-sectional configuration of an insulating section and a periphery thereof in an imaging device according to a fourth modification.
Figure 43:
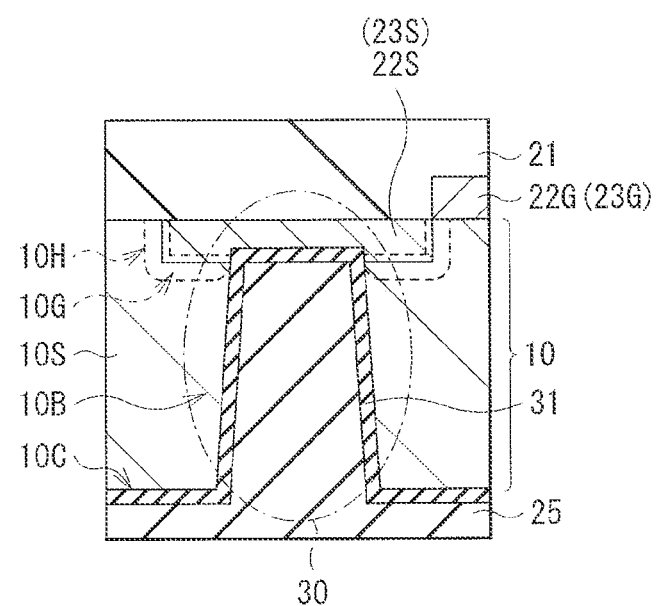
FIG. 43 is a diagram illustrating another example of the cross-sectional configuration of the insulating section and the periphery thereof in the imaging device according to the fourth modification.
Figure 44:
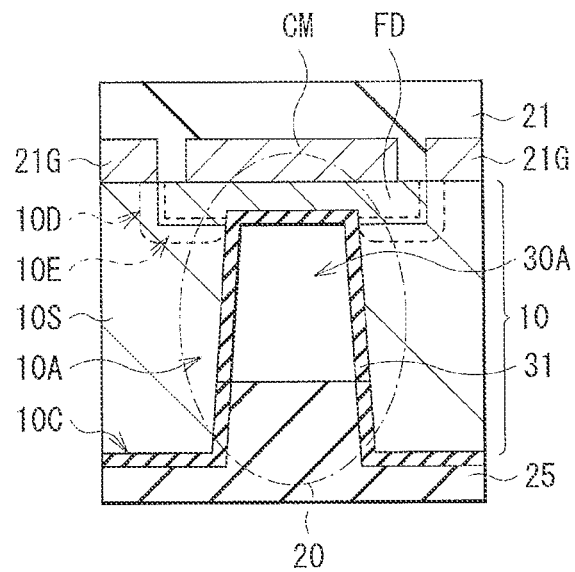
FIG. 44 is a diagram illustrating another example of the cross-sectional configuration of the insulating section and the periphery thereof in the imaging device according to the fourth modification.
Figure 45:
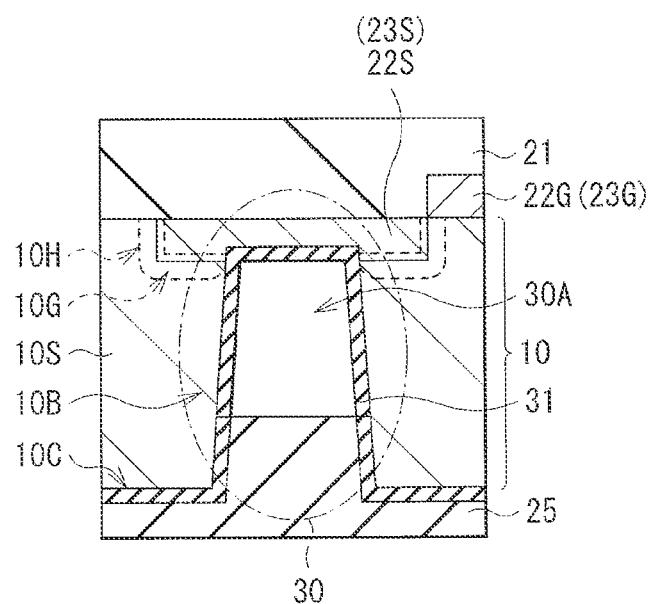
FIG. 45 is a diagram illustrating another example of the cross-sectional configuration of the insulating section and the periphery thereof in the imaging device according to the fourth modification.

In the above-described embodiment and the modifications (the first modification and the second modification) thereof, the insides of the concave portions 10A and 10B are filled with the insulating film 25. However, as shown in FIGS. 40 and 41, for example, hollows 20A and 30A may be provided inside the concave portions 10A and 10B, respectively.

2.4 Fourth Modification

In the above-described embodiment and the modifications (the first, second, and third modifications) thereof, part or whole of the insides of the concave portions 10A and 10B are filled with the insulating film 25. However, as shown in FIGS. 42, 43, 44, and 45, for example, the insulating sections 20 and 30 may each include an insulating film 31 that has a negative fixed potential along the inner surfaces of the concave sections 10A and 10B. The insulating film 31 may include, for example, $HfO_2$ or $Al_2O_3$. The insulating film 31 has a function of reducing increase of the depletion regions 10D and 10H only near the interfaces with the concave portions 10A and 10B. Therefore, occurrence of a leakage current in the intersurfaces with the concave portions 10A and 10B is suppressed. As a result, it is possible to avoid defects in image quality (white spots) resulting from the leakage current, to suppress increase in an operation current resulting from a dark current, etc.

2. Second Embodiment

Figure 46:
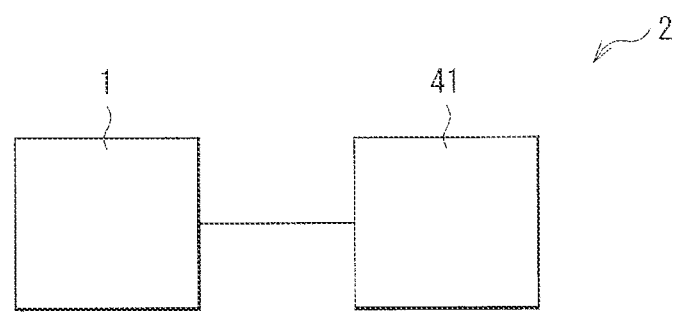
FIG. 46 is a diagram illustrating an example of a schematic configuration of an imaging module according to a second embodiment of the present technology.

FIG. 46 illustrates a schematic configuration of an imaging module 2 according to a second embodiment of the present technology. The imaging module 2 includes the imaging device 1 according to any of the above-described embodiment and the modifications thereof, and an arithmetic section 41 (a signal processing circuit) that performs a predetermined process on a pixel signal outputted from the imaging device 1. The imaging device 1 and the arithmetic section 41 may be mounted, for example, on one wiring substrate. The arithmetic section 41 may be configured, for example, of a DSP (Digital Signal Processor).

In the present embodiment, the imaging device 1 according to any of the above-described embodiment and the modifications thereof is provided. Therefore, it is possible to provide the imaging module 2 that has high image quality.

3. Third Embodiment

Figure 47:
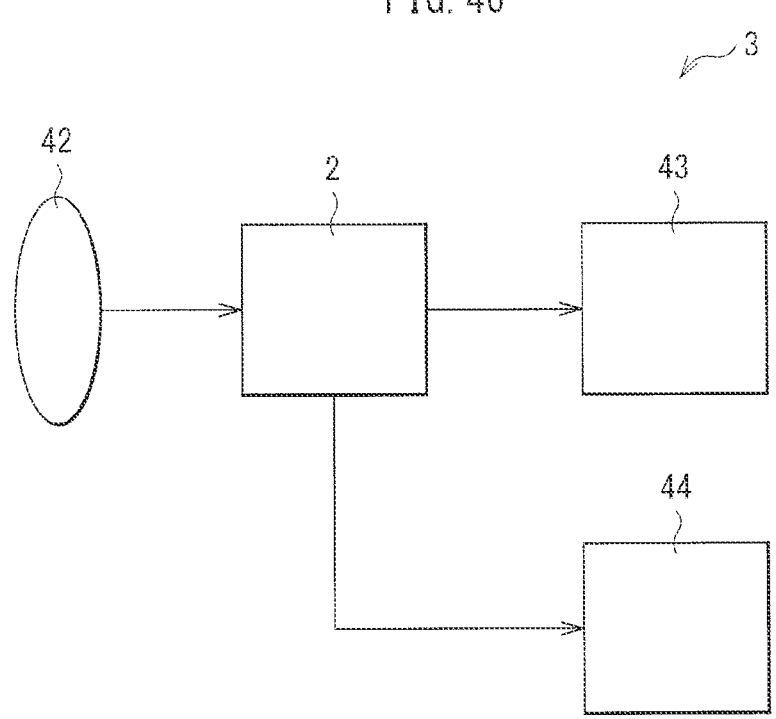
FIG. 47 is a diagram illustrating an example of a schematic configuration of an electronic apparatus according to a third embodiment of the present technology.

FIG. 47 illustrates a schematic configuration of an electronic apparatus 3 according to a third embodiment of the present technology. The electronic apparatus 3 includes the imaging module 2 according to the above-described second embodiment, a lens 42, a display unit 43, and a storage unit 44. The lens 42 allows external light to enter the imaging device 1 in the imaging module 2. The display unit 43 displays an image based on an output from the imaging module 2. The storage unit 44 stores the output from the imaging module 2. It is to be noted that the electronic apparatus 3 may not include the storage unit 44. In this case, the electronic apparatus 3 may include a writing unit that writes information in an external storage unit.

In the present embodiment, the imaging module 2 according to the above-described second embodiment is provided. Therefore, it is possible to provide the electronic apparatus 3 that has high image quality.

Hereinabove, description has been provided referring to some embodiments and modifications thereof. However, the present technology is not limited to the above-described embodiments and the like, and may be variously modified. For example, the imaging device 1 is of a back-surface illumination type in the above-described embodiment and the like. However, the present technology is also applicable to an imaging device of an front-surface illumination type.

It is possible to achieve at least the following configurations from the above-described example embodiments and the modifications of the disclosure.
(1) An imaging device including:
a photodiode configured to perform photoelectric conversion and to generate electric charge in accordance with an amount of received light;
a floating diffusion section configured to accumulate the electric charge generated in the photodiode;
a reading circuit configured to output a pixel signal having a voltage in accordance with a level of the electric charge accumulated in the floating diffusion section, the reading circuit including one or a plurality of transistors each having a gate that is electrically connected to a wiring used for selecting a pixel; and
an insulating section extending into part or whole of a bottom surface of the floating diffusion section, part or whole of bottom surfaces of source-drain regions in the one or the plurality of transistors, or both,
the photodiode, the floating diffusion section, the reading circuit, and the insulating section being provided in a semiconductor layer.
(2) The imaging device according to (1), wherein the insulating section includes a concave portion formed by etching the semiconductor layer from a back surface side thereof, and has a columnar shape.
(3) The imaging device according to (1) or (2), wherein the concave portion extends into a portion that has impurity concentration of $1 \times 10^{18}$ cm$^{-3}$ or higher in the floating diffusion section, the source-drain regions, or both.
(4) The imaging device according to any one of (1) to (3), wherein the insulating section includes a filling layer configured to fill part or whole of inside of the concave portion.
(5) The imaging device according to (4), wherein the filling layer includes one of silicon oxide, SiOF, SiOC, and insulating organic materials.
(6) The imaging device according to any one of (1) to (3), wherein the insulating section has a hollow inside the concave portion.
(7) The imaging device according to any one of (1) to (6), wherein the insulating section has an insulating film along an inner surface of the concave portion, the insulating film having a negative fixed electric potential.
(8) An imaging device according to (7), wherein the insulating film includes one of HfO$_2$ and Al$_2$O$_3$.
(9) An electronic apparatus including:
an imaging device; and
a signal processing circuit configured to perform a predetermined process on a pixel signal outputted from the imaging device,
the imaging device including
a photodiode configured to perform photoelectric conversion and to generate electric charge in accordance with an amount of received light,
a floating diffusion section configured to accumulate the electric charge generated in the photodiode,
a reading circuit configured to output a pixel signal having a voltage in accordance with a level of the electric charge accumulated in the floating diffusion section, the reading circuit including one or a plurality of transistors each having a gate that is electrically connected to a wiring used for selecting a pixel, and
an insulating section extending into part or whole of a bottom surface of the floating diffusion section, part or whole of bottom surfaces of source-drain regions in the one or the plurality of transistors, or both,
the photodiode, the floating diffusion section, the reading circuit, and the insulating section being provided in a semiconductor layer.
(10) A method of manufacturing an imaging device, the method including:
forming a photodiode, for each of pixels, on a top surface of a semiconductor layer, and forming a floating diffusion section and a reading circuit on the top surface of the semiconductor layer, the photodiode being configured to perform photoelectric conversion and to generate electric charge in accordance with an amount of received light, the floating diffusion section being configured to accumulate the electric charge generated in the photodiode, and the reading circuit configured to output a pixel signal having a voltage in accordance with a level of the electric charge accumulated in the floating diffusion section; and
concurrently forming a groove portion and a concave portion on a bottom surface of the semiconductor layer, the groove portion being configured to electrically separate the photodiode for each of the pixels, and the concave portion extending into part or whole of a bottom surface of the floating diffusion section, part or whole of a bottom surface of a source-drain region of a transistor, or both.

(11) The method according to (10), further including, after forming, on the bottom surface of the semiconductor layer, a mask having a belt-like opening that has a wide width portion in part thereof, etching the semiconductor layer through the mask, and thereby forming the concave portion in a portion corresponding to the wide width portion in the opening and forming the groove portion in a portion corresponding to a portion other than the wide width portion in the opening.

(12) The method according to (10), further including, after forming, on the bottom surface of the semiconductor layer, a mask having a lattice-like opening, etching the semiconductor layer through the mask, and thereby forming the concave portion in a portion corresponding to an intersection of a lattice in the opening and forming the groove portion in a portion corresponding to a portion other than the intersection of the lattice in the opening.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device comprising:
    a photodiode configured to perform photoelectric conversion and to generate electric charge in accordance with an amount of received light;
    a floating diffusion section configured to accumulate the electric charge generated in the photodiode;
    a reading circuit configured to output a pixel signal having a voltage in accordance with a level of the electric charge accumulated in the floating diffusion section, the reading circuit including one or more transistors each having a gate that is electrically connected to a wiring used for selecting a pixel; and
    an insulating section extending into at least one of a bottom surface of the floating diffusion section or bottom surfaces of source-drain regions in the one or more transistors, the photodiode, the floating diffusion section, the reading circuit, and the insulating section being provided in a semiconductor layer.

2. The imaging device according to claim 1, wherein the insulating section includes a concave portion formed by etching the semiconductor layer from a back surface side thereof, and has a columnar shape.

3. The imaging device according to claim 2, wherein the concave portion extends into a portion that has impurity concentration of $1 \times 10^{18}$ cm$^{-3}$ or higher.

4. The imaging device according to claim 2, wherein the insulating section includes a filling layer configured to fill at least a portion of the concave portion.

5. The imaging device according to claim 4, wherein the filling layer includes one of silicon oxide, SiOF, SiOC, and insulating organic materials.

6. The imaging device according to claim 2, wherein the insulating section includes a hollow portion within the concave portion.

7. The imaging device according to claim 2, wherein the insulating section includes an insulating film along an inner surface of the concave portion, the insulating film having a negative fixed electric potential.

8. The imaging device according to claim 7, wherein the insulating film includes one of HfO$_2$ and Al$_2$O$_3$.

9. An electronic apparatus comprising:
    an imaging device including:
        a photodiode configured to perform photoelectric conversion and to generate electric charge in accordance with an amount of received light,
        a floating diffusion section configured to accumulate the electric charge generated in the photodiode,
        a reading circuit configured to output a pixel signal having a voltage in accordance with a level of the electric charge accumulated in the floating diffusion section, the reading circuit including one or more transistors each having a gate that is electrically connected to a wiring used for selecting a pixel, and
        an insulating section extending into at least one of a bottom surface of the floating diffusion section or bottom surfaces of source-drain regions in the one or more transistors, the photodiode, the floating diffusion section, the reading circuit, and the insulating section being provided in a semiconductor layer; and
    a signal processing circuit configured to perform a predetermined process on a pixel signal outputted from the imaging device.

10. The electronic apparatus according to claim 9, wherein the insulating section includes a concave portion formed by etching the semiconductor layer from a back surface side thereof, and has a columnar shape.

11. The electronic apparatus according to claim 10, wherein the concave portion extends into a portion that has impurity concentration of $1 \times 10^{18}$ cm$^{-3}$ or higher.

12. The electronic apparatus according to claim 10, wherein the insulating section includes a filling layer configured to fill at least a portion of the concave portion.

13. The electronic apparatus according to claim 12, wherein the filling layer includes one of silicon oxide, SiOF, SiOC, and insulating organic materials.

14. The electronic apparatus according to claim 10, wherein the insulating section includes a hollow portion within the concave portion.

15. The electronic apparatus according to claim 10, wherein the insulating section includes an insulating film along an inner surface of the concave portion, the insulating film having a negative fixed electric potential.

16. The electronic apparatus according to claim 15, wherein the insulating film includes one of HfO$_2$ and Al$_2$O$_3$.

* * * * *